United States Patent
Epstein et al.

(10) Patent No.: US 7,038,452 B2
(45) Date of Patent: May 2, 2006

(54) PRACTICAL PULSE SYNTHESIS VIA THE DISCRETE INVERSE SCATTERING TRANSFORM

(75) Inventors: Charles L. Epstein, Philadelphia, PA (US); Jeremy Magland, North Wales, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 130 days.

(21) Appl. No.: 10/734,799

(22) Filed: Dec. 12, 2003

(65) Prior Publication Data

US 2004/0212363 A1    Oct. 28, 2004

Related U.S. Application Data

(60) Provisional application No. 60/433,407, filed on Dec. 13, 2002.

(51) Int. Cl.
    *G01V 3/00*    (2006.01)
(52) U.S. Cl. .................................................. 324/309
(58) Field of Classification Search ................ 324/307, 324/309
    See application file for complete search history.

(56) References Cited

U.S. PATENT DOCUMENTS

| | | | |
|---|---|---|---|
| 5,153,515 A | 10/1992 | Leigh et al. ................. | 324/307 |
| 5,449,376 A | 9/1995 | Callahan ......................... | 607/2 |
| 5,572,126 A | 11/1996 | Shinnar ....................... | 324/314 |
| 5,821,752 A | 10/1998 | LeRoux ....................... | 324/314 |

OTHER PUBLICATIONS

Beals, R., et al., "Scattering and inverse scattering for first order systems," *CPAM*, 1984, 37, 39-90.
Beals, R., et al. "Scattering and inverse scattering for first order systems: II.," *Inverse Problems*, 1987, 3, 577-593.
Carlson, J., "Exact solutions for selective-excitation pulses. II. Excitation pulses with phase control" *J. of Mag. Res.*, 1992, 97, 65-78.
Carlson, J., "Exact solutions for selective-excitation pulses," *J. of Mag. Res.*, 1991, 94, 376-386.

(Continued)

*Primary Examiner*—Diego Gutierrez
*Assistant Examiner*—Dixomara Vargas
(74) *Attorney, Agent, or Firm*—Woodcock Washburn LLP

(57) ABSTRACT

The discrete inverse scattering (DIST) approach is used to design selective RF-pulses. As in SLR, a hard pulse approximation is used to actually design the pulse. Unlike SLR, the pulse is designed using the full inverse scattering data (the reflection coefficient and the bound states) rather than the flip angle profile. The reflection coefficient is approximated in order to obtain a pulse with a prescribed rephasing time. In contrast to the SLR approach, direct control on the phase of the magnetization profile is retained throughout the design process. Explicit recursive algorithms are provided for computing the hard pulse from the inverse scattering data. These algorithms are essentially discretizations of the Marchenko equations. When bound states are present, both the left and right Marchenko equations are used in order to improve the numerical stability of the algorithm. The DIST algorithm is used in preferred applications to generate pulses for use in magnetic resonance imaging, although it has applications in other two-level quantum systems such as quantum computing and spintronics.

32 Claims, 11 Drawing Sheets

OTHER PUBLICATIONS

Grünbaum, F., et al., "An exploration of the invertibility of the bloch transform," *Inverse Problems*, 1986, 2, 75-81.

Le Roux, "Exact synthesis of radio frequency waveforms," *Proceedings of 7th Annual Meeting of SMRM*, 1988, p. 1049.

Moses, H.E., et al., "Eigenvalues and eigenfunctions associated with the gel'fand-levitan equation," *J. Math. Phys.*, 1984, 25(1), 108-112.

Pauly, J., et al., "Parameter relations for the Shinnar-Le Roux Selective excitation pulse design algorithm," *IEEE Trans. On Med. Imaging*, 1991, 10(1), 53-65.

Rourke, D.E., et al., "The inverse scattering transform and its use in the exact inversion of the bloch equation for noninteracting spins," *J. of Mag. Res.*, 1992, 99, 1-20.

Rourke, D.E., A simple relationship between total RF pulse energy and magnetization response—the nonlinear generalization of parseval's relation, *J. of Mag. Reson.*, 1995, Series A(115), 189-196.

Shinnar, et al., "The application of spinors to pulse synthesis and analysis," *Mag. Res. In Med.*, 1989, 12, 93-98.

Shinnar, et al., "The synthesis of pulse sequences yielding arbitrary magnetization vectors," *Mag. Res. In Med.*, 1989, 12, 74-80.

Shinnar, M., et al., "The synthesis of soft pulses with a specified frequency response," *Mag. Res. In Med.*, 1989, 12, 88-92.

Shinnar, et al., in "Inversion of the bloch equation," *J. chem . . . Phys.*, 1993, 98(8), 6121-6128.

Zakharov, V., et al., "Korteweg-de Vries equation, a completely integrable Hamiltonian system," *Funk. Anal. Prilöz*, 1971, 5(4), 18-27 (translated).

Zakharov, V., et al., "On the complete integrability of the non-linear Schrödinger equation," *Teor. Mat. Fiz.*, 1974, 19(3), 332-343 (translated).

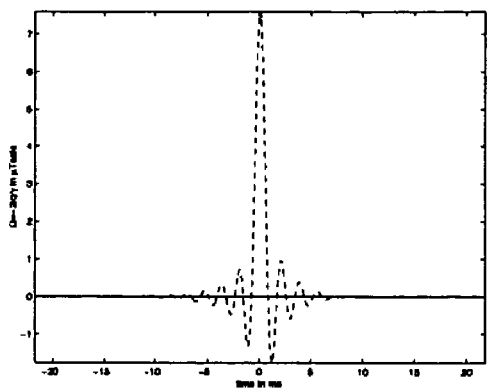
(Fig. 1a) Sharp truncation by .001% criterion.
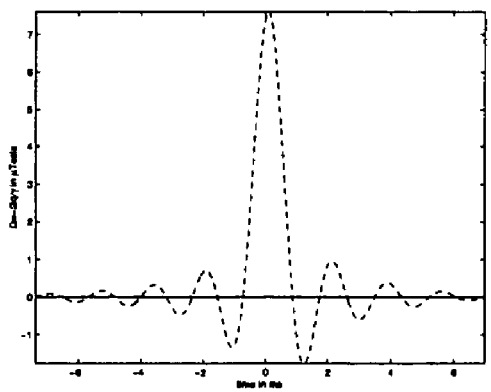
(Fig. 1b) Sharp truncation by 1% criterion.
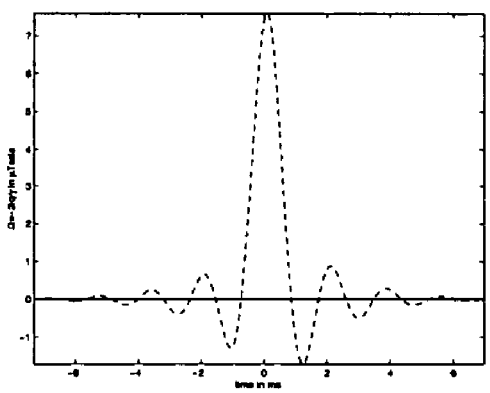
(Fig. 1c) Smooth truncation by 1% criterion.
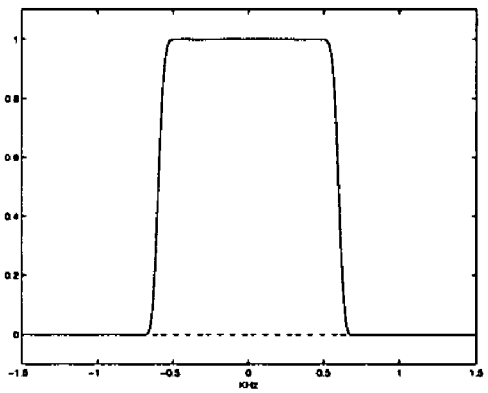
(Fig. 1d) Transverse magnetization produced by (a).
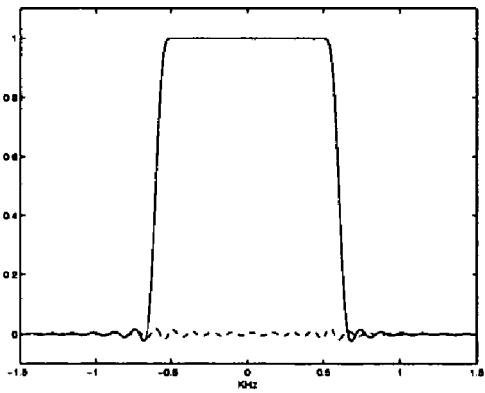
(Fig. 1e) Transverse magnetizatio produced by (b).
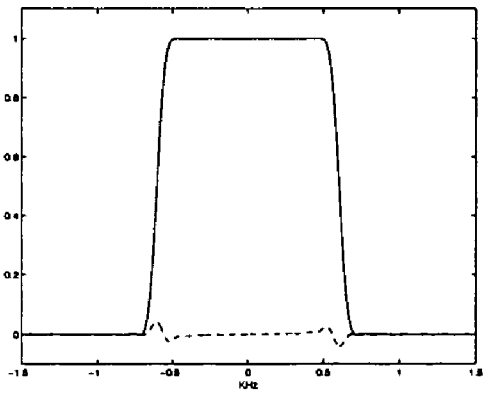
(Fig. 1f) Transverse magnetizatio produced by (c).

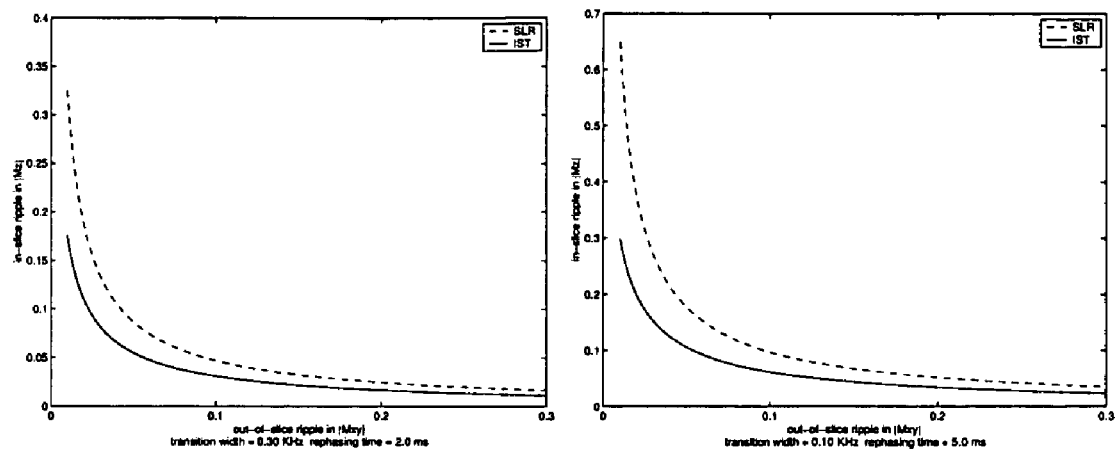
(Fig. 2a) Transition width = 0.3 KHz, rephasing time = 2.0 ms
(Fig. 2b) Transition width = 0.1 KHz, rephasing time = 5.0 ms

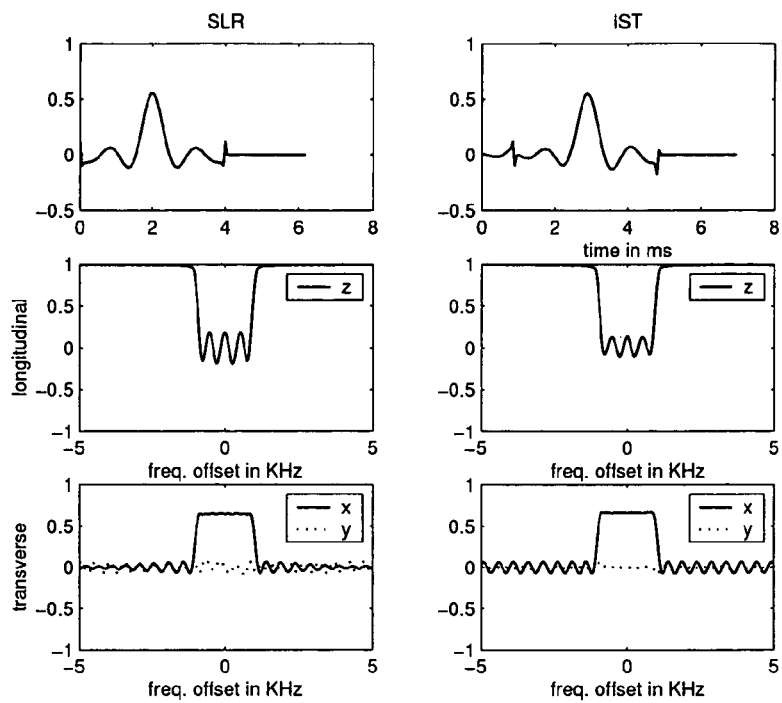
(Fig. 4a) $T_2 = 10$ ms for a 90° pulse with 2 ms rephasing time, $\delta_2 = 0.1$, and 0.2 KHz transition width
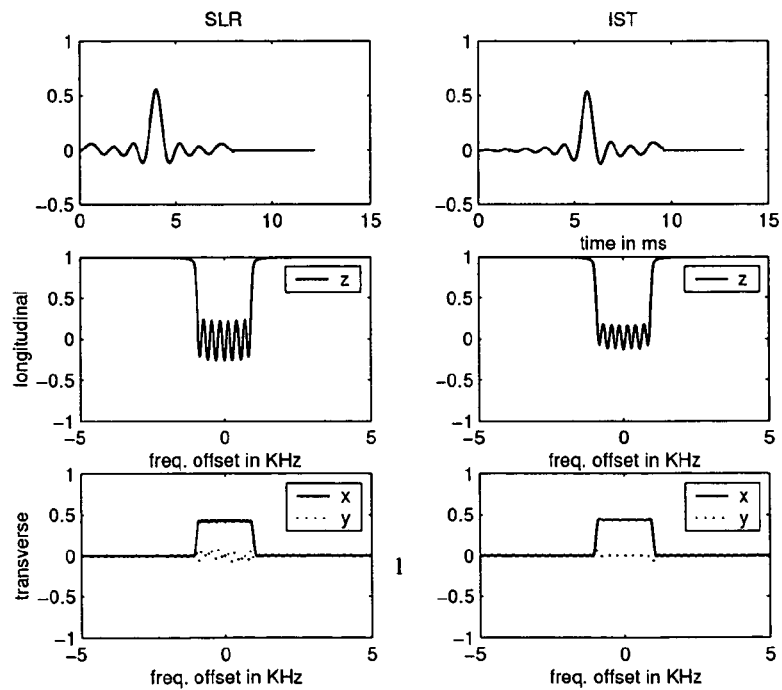
(Fig. 4b) $T_2 = 10$ ms for a 90° pulse with 4 ms rephasing time, $\delta_2 = 0.01$, and 0.15 KHz transition width.
Figure 4

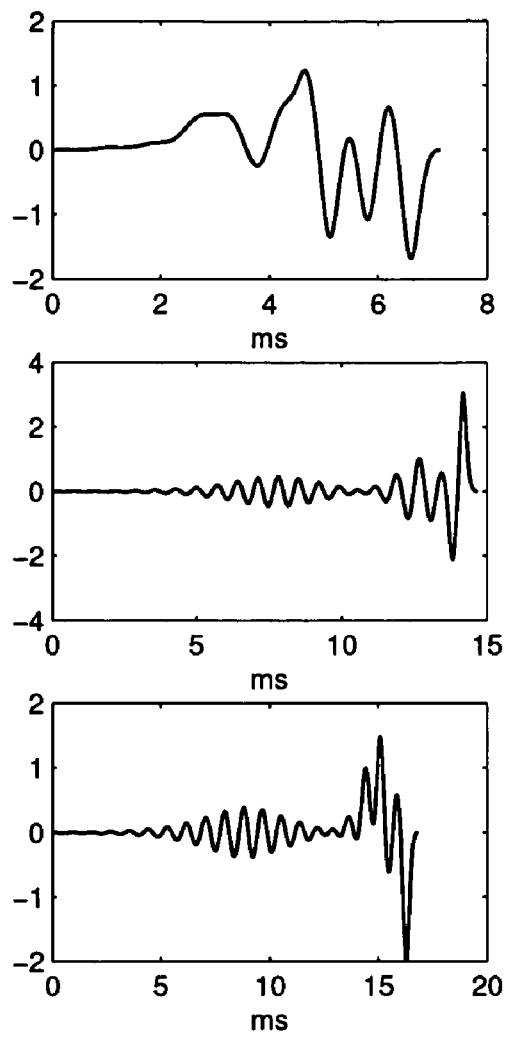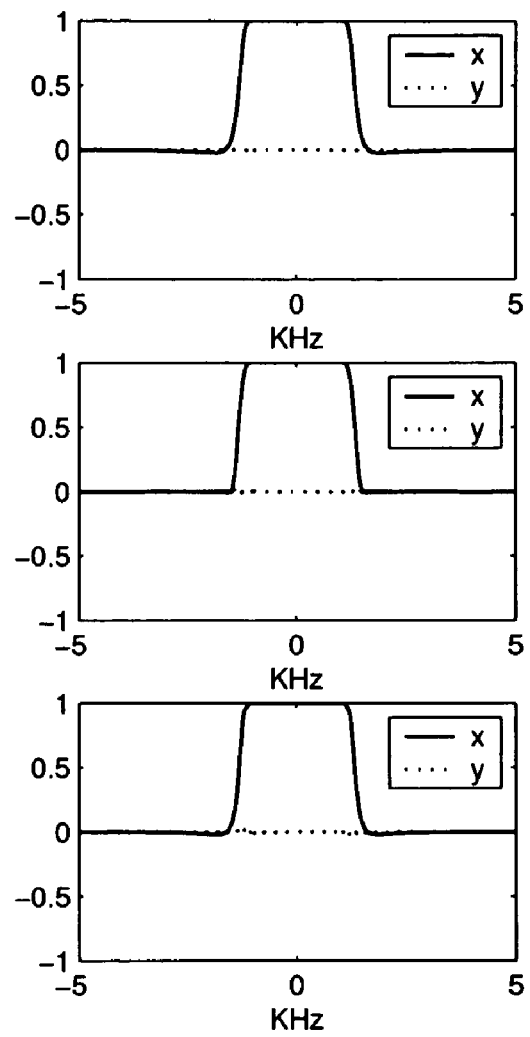
Figure 6

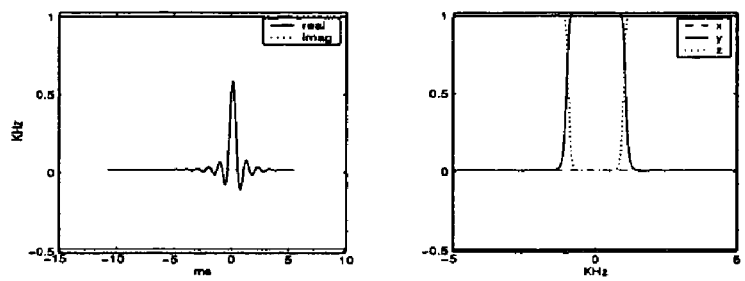

(Fig. 7A) The minimum energy pulse with magnetization profile $M$.

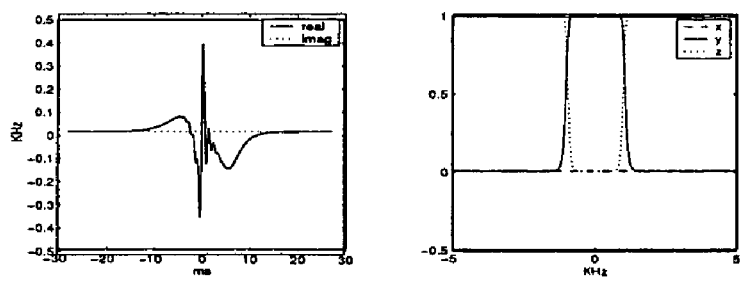

(Fig. 7b) The pulse with magnetization profile $M$, and a bound state at $0.5i$ with norming constant 1.0.

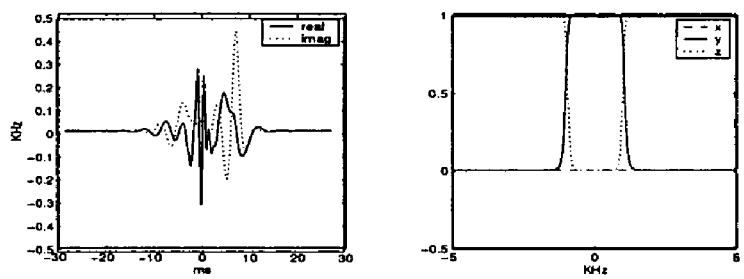

(Fig. 7c) The pulse with magnetization profile $M$, and bound states at $0.5i + 1.4$, and $1.0i - 1.0$, with norming constants: 1, and $-10$.

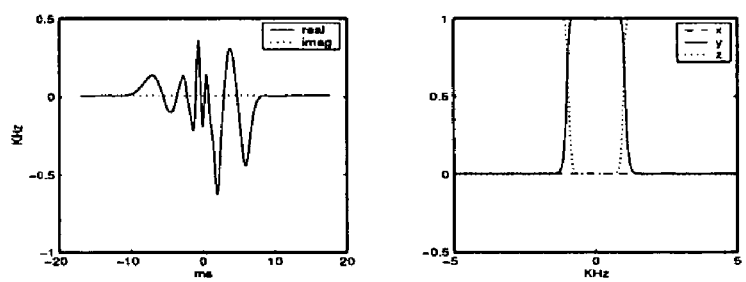

(Fig. 7d) The pulse with magnetization profile $M$, and bound states and $i - 1$, $i$, and $i + 1$, and norming constants 1, 2, and 1.

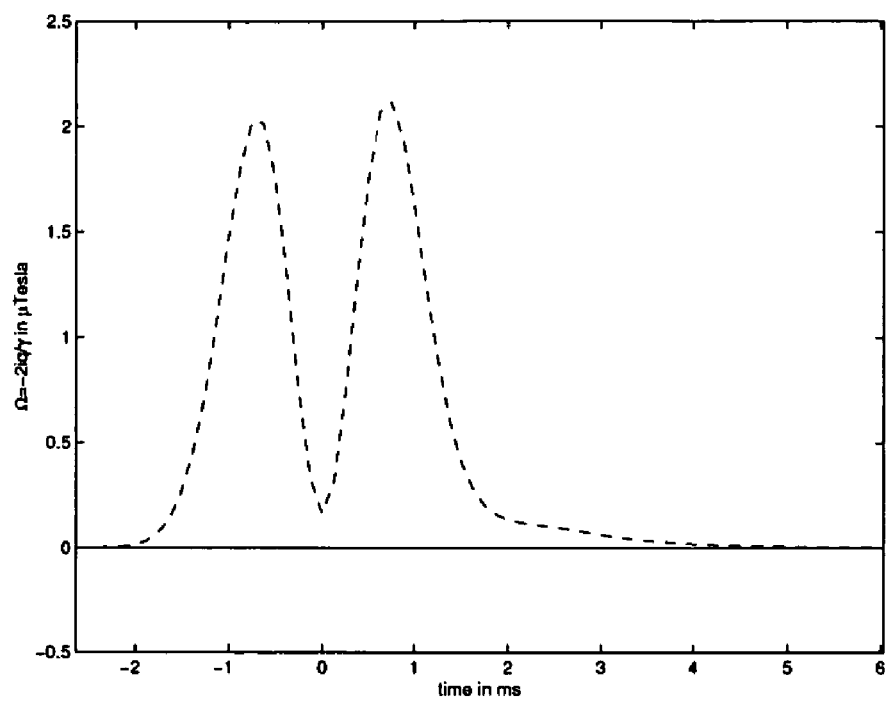
(Fig. 8a) Minimum energy pulse pulse.
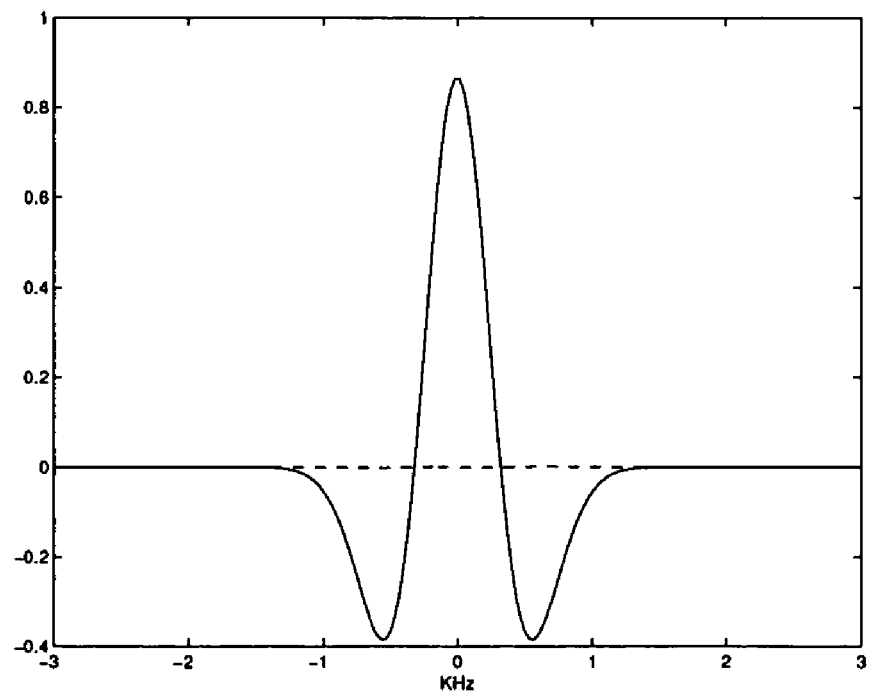
(Fig. 8b) Transverse magnetization profile.

PRACTICAL PULSE SYNTHESIS VIA THE DISCRETE INVERSE SCATTERING TRANSFORM

CROSS-REFERENCE TO RELATED APPLICATIONS

The present application claims priority to U.S. Provisional Patent Application No. 60/433,407, filed Dec. 13, 2002, the contents of which are incorporated herein in their entirety.

GOVERNMENT SUPPORT

The present invention was supported by the National Science Foundation under Grant Nos. NSF DMS99-70487 and NSF DMS02-07123. The government may have certain rights in the invention.

FIELD OF THE INVENTION

The present invention relates to the generation of pulses using the discrete inverse scattering transform (DIST) and, more particularly, to a technique for obtaining RF-pulse envelopes that produce a specified magnetization profile, to within a predetermined error, for use in MRI and other applications.

BACKGROUND OF THE INVENTION

Brief Summary of the Pulse Synthesis Problem

The synthesis of RF pulse sequences to produce selective excitation is a problem of principal importance in all applications of nuclear magnetic resonance. To discuss this problem, one needs to introduce the Bloch equation without relaxation, which is usually written in the form:

$$\frac{dM}{dt} = \gamma M \times B. \tag{1}$$

Here M is the magnetization, B is the applied magnetic field, t is time and $\gamma$ is the gyromagnetic ratio. A solution to this equation has constant length which is assumed throughout to equal 1. The Bloch equation is usually analyzed in a "rotating reference" frame. Ordinarily the rotating reference frame is related to the "laboratory frame" by a time dependent orthogonal transformation of the form:

$$F(t) = \begin{bmatrix} \cos\theta(t) & -\sin\theta(t) & 0 \\ \sin\theta(t) & \cos\theta(t) & 0 \\ 0 & 0 & 1 \end{bmatrix}, \tag{2}$$

so that $$M(t) = F(t)m(t).$$

One uses m to denote the magnetization in the rotating reference frame. Larmour's Theorem implies that if M satisfies (1) then m satisfies $$\frac{dm}{dt} = \gamma m \times B_{\mathit{eff}} \tag{3}$$

where (4)

$$B_{\mathit{eff}}(t) = F^{-1}(t)B(t) + \frac{1}{\gamma}\Omega(t) \text{ with } \Omega(t) = (0, 0, \theta'(t))^t.$$

In most applications of this method, the function $\theta$ is selected to render the z-component of $B_{\mathit{eff}}$ independent of time, $$B_{\mathit{eff}}(f;t) = (\omega_1(t), \omega_2(t), \gamma^{-1}f). \tag{5}$$

The constant value f is called the offset frequency or resonance offset. If one sets $\omega(t) = \omega_1(t) + i\omega_2(t)$ then, in the laboratory frame, the RF-envelope takes the form:

$$p(t) = \omega(t)e^{i\theta(t)}.$$

The energy in the RF-envelope is given by $$W_p = \int_{-\infty}^{\infty} |p(t)|^2 dt = \int_{-\infty}^{\infty} |\omega(t)|^2 dt. \tag{6}$$

The magnetization profile is a unit 3-vector valued function defined for $f \in \mathbb{R}$, $$m^{\infty}(f) = \begin{bmatrix} m_1^{\infty}(f) \\ m_2^{\infty}(f) \\ m_3^{\infty}(f) \end{bmatrix}.$$

In essentially all MR applications $m^{\infty}(f) = [0,0,1]^t$ outside of a finite interval. In most earlier approaches to pulse synthesis, the flip angle profile, defined as:

$$\phi(f) = \cos^{-1}(m_3^{\infty}(f)).$$

was used to design the pulse, with the phase of transverse magnetization determined, implicitly, by the algorithm. Typically, this is referred to as "recovering" the phase.

The problem of RF-pulse synthesis is to find a time dependent complex pulse envelope $\omega(t)$ so that, if $B_{\mathit{eff}}(f)$ is given by (5), then the solution of:

$$\frac{dm}{dt}(f;t) = \gamma m(f;t) \times B_{\mathit{eff}}(f;t) \text{ with } \lim_{t \to -\infty} m(f;t) = (0, 0, 1)^t \tag{7}$$

satisfies $$\lim_{t \to \infty} [e^{-ift}(m_1 + im_2)(f;t), m_3(f;t)] = [(m_1^{\infty} + im_2^{\infty})(f), m_3^{\infty}(f)]. \tag{8}$$

The standard complex notation, $m_1 + im_2$ has been used for the transverse components of the magnetization. If $\omega_1(t) + i\omega_2(t)$ is supported in the interval $[t_0, t_1]$, then these asymptotic conditions are replaced by:

$$m(v; t_0) = [0, 0, 1]^t,$$

$$|e^{-iv t_1}(m_1 + im_2)(v; t_1), m_3(v; t_1)| = |(m_1^{\infty} + im_2^{\infty})(v), m_3^{\infty}(v)|. \tag{9}$$

The mapping from $\omega_1(t)+i\omega_2(t)$ to $m^\infty$ (as defined in Equations (7) and (8)) is highly nonlinear; the problem of pulse synthesis is that of inverting this mapping.

To solve the problem of RF-pulse synthesis, it is convenient to introduce the spin domain formulation of the Bloch equation. Instead of a unit vector m in $\mathbb{R}^3$, one solves for a unit vector $\psi$ in $\mathcal{C}^2$. This vector satisfies the 2×2 matrix equation:

$$\frac{d\psi}{dt} = -\frac{i}{2}\omega \cdot \sigma \psi. \qquad (10)$$

Here $\omega = -[\gamma\omega_1(t), \gamma\omega_2(t), v]$, and $\sigma$ are the Pauli spin matrices:

$$\sigma 1 = \begin{bmatrix} 0 & 1 \\ 1 & 0 \end{bmatrix}, \quad \sigma 2 = \begin{bmatrix} 0 & -i \\ i & 0 \end{bmatrix}, \quad \sigma 3 = \begin{bmatrix} 1 & 0 \\ 0 & -1 \end{bmatrix}. \qquad (11)$$

Assembling the pieces, it can be seen that $\psi$ satisfies:

$$\frac{d\psi}{dt}(\xi;t) = \begin{bmatrix} -i\xi & q(t) \\ -q^*(t) & i\xi \end{bmatrix}\psi(\xi;t), \qquad (12)$$

with $$\xi = \frac{v}{2}, \quad q(t) = \frac{-i\gamma}{2}(\omega_1(t) - i\omega_2(t)). \qquad (13)$$

where q* is the complex conjugate of the complex number q.

A simple recipe takes a solution of Equation (12) and produces a solution of Equation (7). If $\psi(\xi;t)=[\psi_1(\xi;t), \psi_2(\xi;t)]^\dagger$ satisfies Equation (12), then the 3-vector:

$$m(v;t) = [2\text{Re}(\psi_1^*\psi 2), 2\text{Im}(\psi_1^*\psi 2), |\psi 1|^2 - |\psi 2|^2]^\dagger\left(\frac{v}{2};t\right) \qquad (14)$$

satisfies Equation (7). If in addition:

$$\lim_{t\to-\infty} e^{i\xi t}\psi(\xi;t) = \begin{bmatrix} 1 \\ 0 \end{bmatrix} \qquad (15)$$

then m satisfies Equation (7). Thus, the RF-pulse synthesis problem is easily translated into an inverse scattering problem for Equation (12). This is described in the next section. Following the standard practice in inverse scattering, Equation (12) is referred to as the ZS-system and q as the potential.

Scattering Theory for the ZS-system

Scattering theory for equations like those above relates the behavior of $\psi(\xi;t)$, as $t\to-\infty$ to that of $\psi(\xi;t)$; as $t\to+\infty$. If q has bounded support, then the functions:

$$\begin{bmatrix} e^{-i\xi t} \\ 0 \end{bmatrix}, \begin{bmatrix} 0 \\ e^{i\xi t} \end{bmatrix} \qquad (16)$$

are a basis of solutions outside the support of q. If the $L^1$-norm of q is finite, then, it is known that there are solutions that are asymptotic to these solutions as $t\to\pm\infty$.

Theorem 1. If $\|q\|_{L^1}$ is finite, then, for every real $\xi$; there are unique solutions:

$$\psi_{1+}(\xi), \psi_{2+}(\xi) \text{ and } \psi_{1-}(\xi), \psi_{2-}(\xi) \qquad (17)$$

which satisfy:

$$\lim_{t\to-\infty} e^{i\xi t}\psi_{1-}(\xi;t) = \begin{bmatrix} 1 \\ 0 \end{bmatrix}, \lim_{t\to-\infty} e^{-i\xi t}\psi_{2-}(\xi;t) = \begin{bmatrix} 0 \\ -1 \end{bmatrix} \qquad (18)$$

$$\lim_{t\to\infty} e^{i\xi t}\psi_{1+}(\xi;t) = \begin{bmatrix} 1 \\ 0 \end{bmatrix}, \lim_{t\to\infty} e^{-i\xi t}\psi_{2+}(\xi;t) = \begin{bmatrix} 0 \\ 1 \end{bmatrix} \qquad (19)$$

The solutions $\psi_{1-}(\xi)$, $\psi_{2+}(\xi)$ extend as analytic functions of $\xi$ to the upper half plane, $\{\xi : \text{Im}\xi > 0\}$ and $\psi_{2-}(\xi)$, $\psi_{1+}(\xi)$ extend as analytic functions of $\xi$ to the lower half plane, $\{\xi : \text{Im}\xi > 0\}$. The proof of this theorem can be found in Ablowitz, et al., "The inverse scattering transform-Fourier analysis for nonlinear problems," Studies in Applied Math., Vol. 53, (1974), pp. 249–315.

For real values of $\xi$ the solutions normalized at $-\infty$ can be expressed in terms of the solutions normalized at $+\infty$ by linear relations:

$$\psi_{1-}(\xi;t) = a(\xi)\psi_{1+}(\xi;t) + b(\xi)\psi_{2+}(\xi;t),$$

$$\psi_{2-}(\xi;t) = b^*(\xi)\psi_{1+}(\xi;t) - a^*(\xi)\psi_{2+}(\xi;t). \qquad (20)$$

The functions a; b are called the scattering coefficients for the potential q. The 2×2-matrices $[\psi_{1-}\psi_{2-}]$, $[\psi_{1+}\psi_{2+}]$ satisfy:

$$[\psi_{1-}\psi_{2-}] = [\psi_{1+}\psi_{2+}]\begin{bmatrix} a(\xi) & b^*(\xi) \\ b(\xi) & -a^*(\xi) \end{bmatrix}. \qquad (21)$$

The scattering matrix for the potential q is defined to be:

$$s(\xi) = \begin{bmatrix} a(\xi) & b^*(\xi) \\ b(\xi) & -a^*(\xi) \end{bmatrix}. \qquad (22)$$

It is not difficult to show that:

$$a(\xi) = [\psi_{11-}(\xi;t)\psi_{22+}(\xi;t) - \psi_{21-}(\xi;t)\psi_{12+}(\xi;t)] \qquad (23)$$

It follows from Theorem 1 and Equation (23) that a extends to the upper half plane as an analytic function. Also, if $\{\xi_1, \ldots, \xi_n\}$ is a list of the zeros of a, then Equation (23) implies that for each j there is a nonzero complex number $C'_j$ so that:

$$\psi_{1-}(\xi_j) = C'_j\psi_{2+}(\xi_j), j=1, \ldots, N. \qquad (24)$$

The reflection coefficient is defined by:

$$r(\xi) = \frac{b(\xi)}{a(\xi)}. \tag{25}$$

A priori the reflection coefficient is only defined on the real axis. Since $|a(\xi)|^2 + |b(\xi)|^2 = 1$, $a(\xi)$ may be expressed in terms of $r(\xi)$ as:

$$a(\xi) = \prod_{j=1}^{n}\left(\frac{\xi-\xi_j}{\xi-\xi_j^*}\right)\exp\left[\frac{i}{2\pi}\int_{-\infty}^{\infty}\frac{\log(1+|r(\zeta)|^2)d\zeta}{\zeta-\xi}\right]. \tag{26}$$

Equation (26) has a well defined limit as $\xi$ approaches the real axis.

If $a$ has simple zeros at the points $\{\xi_1, \ldots, \xi_N\}$ (so that $a'(\xi_j) \neq 0$), then the norming constants are defined by setting:

$$C_j = \frac{C'_j}{a'(\xi_j)}, \tag{27}$$

where the $\{C'_j\}$ are defined in Equation (24). The definition needs to be modified if $a$ has nonsimple zeros. The reason for replacing $\{C'_j\}$ with $\{C_j\}$ will become more apparent below. The pairs $\{(\xi_j, C_j)\}$ are often referred to as the discrete data, or bound state data.

The function $r(\xi)$, for $\xi \in \mathbb{R}$ and the collection of pairs $\{(\xi_j, C_j): j=1, \ldots, N\}$ define the reduced scattering data. Implicitly the reduced scattering data is a function of the potential $q$. In inverse scattering theory, the data $\{r(\xi)$ for $\xi \in \mathbb{R}; (\xi_1, C_1), \ldots, (\xi_N, C_N)\}$ are specified, and a potential $q$ is sought that has this reduced scattering data. The map from the reduced scattering data, or the mathematically equivalent data, to $q$ is often called the Inverse Scattering Transform or IST.

The RF-pulse synthesis problem will now be rephrased as an inverse scattering problem. Since the data for the pulse synthesis problem is the magnetization profile $m\infty$, a function of $\xi = v/2$. The solution $\psi_{1-}$ to the ZS-system defines a solution $m_{1-}$ to:

$$\frac{dm}{dt}(v;t) = \gamma m(v;t) \times B_{eff}(v;t), \tag{28}$$

with $$\lim_{t \to -\infty} m(v;t) = [0, 0, 1]^{\dagger}, \tag{29}$$

It follows from Equations (19) and (20) that:

$$\psi_{1-}(\xi;t) \sim \begin{bmatrix} a(\xi)e^{-i\xi t} \\ b(\xi)e^{i\xi t} \end{bmatrix}, \text{ as } t \to +\infty. \tag{30}$$

Therefore:

$$m_{1-}(\xi;t) \sim \begin{bmatrix} 2b(\xi)a^*(\xi)e^{2i\xi t} \\ |a(\xi)|^2 - |b(\xi)|^2 \end{bmatrix}, \text{ as } t \to +\infty. \tag{31}$$

The complex notation for the transverse components of $m_{1-}$ are used. If $m_{1-}$ also satisfies:

$$\lim_{t \to \infty}[e^{-ivt}(m_1+im_2)(v;t), m_3(v;t)] = [(m_1^{\infty}+im_2^{\infty})(v), m_3^{\infty}(v)]. \tag{32}$$

then it follows from Equation (31) and $|a(\xi)|^2 + |b(\xi)|^2 = 1$ that:

$$r(\xi) = \frac{b(\xi)}{a(\xi)} = \lim_{t \to \infty} \frac{(m_{11-}+im_{21-})(\xi;t)e^{-2i\xi t}}{1+m_{31-}(\xi;t)} \tag{33}$$

$$= \frac{(m_1^{\infty}+im_2^{\infty})(\xi)}{1+m_3^{\infty}(\xi)}.$$

If $q$ has support in the ray $(-\infty, t_1)$ then:

$$r(\xi) = \frac{(m_{11-}+im_{21-})(\xi;t)e^{-2i\xi t}}{1+m_{31-}(\xi;t)} \tag{34}$$

is independent of $t$ for $t \geq t_1$. It is also useful to observe that if $r(\xi)$ is the reflection coefficient, determined by the potential $q(t)$, then $e^{-2i\tau\xi}r(\xi)$ is the reflection coefficient determined by the time shifted potential $q_\tau(t) = q(t-\tau)$.

As $m\infty(\xi)$ is a unit vector valued function, the reflection coefficient $r(\xi)$ uniquely determines $m\infty(\xi)$ and vice-versa. Thus, the RF-pulse synthesis problem can be rephrased as the following inverse scattering problem:

Find a potential $q(t)$ for the ZS-system so that the reflection coefficient $r(\xi)$ satisfies Equation (33) for all real $\xi$.

The pulse synthesis problem makes no reference to the data connected with the bound states, i.e. $\{(\xi_j, C_j)\}$. Indeed these are free parameters in the RF-pulse synthesis problem, making the problem highly underdetermined.

The flip angle profile, $\phi(\xi)$, is related to the scattering data by:

$$\varphi(\xi) = \sin^{-1}\left(\frac{2|r(\xi)|}{1+|r(\xi)|^2}\right) = 2\sin^{-1}(|b(\xi)|). \tag{35}$$

SLR pulses are usually designed using the flip angle profile, and the phase of the reflection coefficient of the designed pulse is determined indirectly. In this context, the reflection coefficient determined by the pulse envelope is an approximation to a function of the form $e^{i\phi(\xi)}r(\xi)$ where $r(\xi)$ is the "ideal" reflection coefficient. The function $\phi(\xi)$ is the phase error and it is implicitly determined by details of the SLR algorithm. If $\phi(\xi)$ is approximately linear over the support of $r(\xi)$, then the magnetization can be approximately rephased. In this case, the actual rephasing time comes in part from $t_1$, the maximum value of $t$ within the effective support of $q(t)$ (i.e., the largest interval where the value of the potential is large enough to produce a measurable effect), and in part from the phase factor, $e^{i\phi(\xi)}$.

A formula for the energy of the pulse envelope may be stated in terms of the reduced scattering data. This formula is quite different from the formula taught by Pauly et al. that relates the energy in an SLR-pulse to a parameter, $a_0$, which arises as an intermediate step in their construction. It does not provide an explicit formula for the energy in terms of the magnetization profile and auxiliary parameters. Moreover, it is not evident from this formula how the energy depends on the locations of the bound states. The underlying results from inverse scattering theory are due to Zakharov, Faddeev and Manakov.

Theorem 2. Suppose that q(t) is a sufficiently rapidly decaying potential for the ZS-system, with reflection coefficient $r(\xi)$, and discrete data $\{(\xi_j, C_j), j=1, \ldots, N\}$, then:

$$\int_{-\infty}^{\infty} |q(t)|^2 \, dt = \frac{1}{\pi} \int_{-\infty}^{\infty} \log(1 + |r(\xi)|^2) \, d\xi + 4 \sum_{j=1}^{N} (\operatorname{Im} \xi)_j. \quad (36)$$

Prior Approaches to Pulse Synthesis

The oldest method of pulse synthesis is the Fourier transform method. The Fourier method is a simple linear approximation for this highly non-linear process. It provides usable results for small flip angles, but is largely an ad hoc method. Notwithstanding the fact that this method is an approximation for all non-zero flip angles, it gives surprisingly good results for flip angles up to about $$\frac{\pi}{2}.$$

Over the past fifteen years two, more exact, approaches to solving this problem have been introduced and explored. The slightly older, generally accepted method is the Shinnar-Le Roux- or SLR-algorithm introduced independently by M. Shinnar and his co-workers (U.S. Pat. No. 5,153,515; U.S. Pat. No. 5,572,126; Shinnar, et al., "The Synthesis of Pulse Sequences Yielding Arbitrary Magnetization Vectors," Mag. Res. In Med., Vol. 12 (1989), pp. 74–88; and Shinnar et al. "The Application of Spinors to Pulse Synthesis and Analysis," Mag. Res. in Med., Vol. 12 (1989) pp. 93–98) and P. Le Roux (U.S. Pat. No. 5,821,752; P. Le Roux, "Exact Synthesis of Radio Frequency Waveforms," Proceedings of 7th Annual Meeting of SMRM, 1988, p.1049; J. Pauly et al., "Parameter Relations for the Shinnar-Le Roux Selective Excitation Pulse Design Algorithm," IEEE Trans. On Med. Imaging, Vol. 10 (1991), pp. 53–65) The second method is to use the inverse scattering transform, or IST, which was first introduced as a technique for pulse synthesis by Grunbaum et al. in "An Exploration of the Invertibility of the Bloch Transform," Inverse Problems, Vol. 2 (1986), pp. 75–81, and later refined by J. Carlson, "Exact Solutions for Selective-Excitation Pulses," J. of Mag. Res., Vol. 94 (1991), pp. 376–386, and "Exact Solutions for Selective-Excitation Pulses. II. Excitation Pulses with Phase Control," J. of Mag. Res., Vol. 97 (1992), pp. 65–78; and Rourke et al., "The Inverse Scattering Transform and its Use in the Exact Inversion of the Bloch Equation for Noninteracting Spins," J. of Mag. Res., Vol. 99 (1992), pp. 118–138. There are also approaches which use optimization techniques from control theory, but such approaches are not particularly relevant to the subject matter of the invention and thus will not be discussed further.

In the SLR-method, one approximates not the desired magnetization profile, but the flip angle profile derived from it. It is approximated by a rational function, $r_0$ of $e^{i f \Delta/2}$. Using standard polynomial design techniques, one finds a hard pulse, that is, a sequence of equally spaced δ-pulses:

$$q_0 = \sum_{j=1}^{N} \mu_j \delta(t - j\Delta),$$

which produces an approximation, $m_0$, to the desired magnetization. Note, however, that only the flip angle is directly controlled. The phase of the excitation is determined implicitly by the algorithm used to construct $r_0$. By specifying only the flip angle profile, the SLR approach retains more direct control over the total duration of the RF-pulse.

The forward scattering analysis has a well-defined limit for potentials of the form $q_0(t)$. In this case, the scattering matrix takes the special form:

$$s(\xi) = \begin{bmatrix} e^{iN\Delta\xi} A_0(e^{-i\Delta\xi}) & e^{iN\Delta\xi} B_0^*(e^{-i\Delta\xi}) \\ e^{-iN\Delta\xi} B_0(e^{-i\Delta\xi}) & -e^{-iN\Delta\xi} A_0^*(e^{-i\Delta\xi}) \end{bmatrix} \quad (37)$$

where $A_0(z)$ and $B_0(z)$ are polynomials of degree N-1. The reflection coefficient $r_0(\xi)$, defined by $q_0(t)$, is the periodic function of period $\Delta^{-1} 2\pi$ given by:

$$r_0(\xi) = \frac{e^{-2iN\Delta\xi} B_0(e^{-i\Delta\xi})}{A_0(e^{-i\Delta\xi})}. \quad (38)$$

Thus, the SLR algorithm has two parts: 1. Find polynomials of the given degrees, so that $r_0(\xi)$ is, in a certain sense, an approximation to $r_t(\xi)$. 2. Use a recursive method for determining the coefficients, $\{\mu_j\}$, so that $q_0(t)$ given as:

$$q_0(t) = \sum_{j=1}^{N} \mu_j \delta(t - j\Delta), \quad (39)$$

has reflection coefficient $r_0(\xi)$.

Of course, a sum of δ-pulses is nonphysical, requiring infinite energy to realize. The RF-envelope that is actually used is a "softened" version of $q_0(t)$. For example, one could replace each $\mu_j \delta(t-j\Delta)$ by a boxcar pulse of width Δ with the same area, leading to the softened pulse:

$$q_1(t) = \sum_{j=1}^{N} \frac{\mu_j}{\Delta} x(0, \Delta)(t - j\Delta). \quad (40)$$

While the difference $q_0(t) - q_1(t)$ can only be made small in the sense of generalized functions, the difference $|r_0(\xi) - r_1(\xi)|$ can be made pointwise small, for ξ in a fixed interval, provided that none of the $\{\mu_j\}$ is too large. This is what is usually meant by the "hard pulse approximation" described by Shinnar et al.

Careful control of the duration is important in applications that involve imaging samples with a short $T_2$, or spin-spin relaxation time. Spin-spin relaxation only becomes important. At least for minimum energy pulses, this occurs near the peak of the pulse. The duration of the pulse after the peak is almost equal to the rephasing time. Hence, in order to design pulses for experiments with a short $T_2$, it is really only necessary to control the rephasing time, which is possible in IST pulse design. In practice, a pulse designed using the IST method has only slightly longer duration than the SLR pulse, with the same design parameters. In numerical simulations, an IST pulse appears to be slightly less susceptible to errors caused by spin-spin relaxation, than the comparable SLR pulse.

The SLR-method does not directly control the phase of the transverse magnetization profile nor do the "auxiliary parameters," inherent in the pulse design problem, arise in this approach. In truth, the SLR approach does not solve the pulse design problem, per se, though in many important instances, it produces a result which is adequate for most current applications.

From a practical perspective, both IST and SLR require considerable computation. From the inverse scattering formalism, it is clear that there are many possible RF-envelopes that will produce the same magnetization profile. There are also auxiliary parameters in the SLR method. Changing the auxiliary parameters that appear in SLR changes the phase of the magnetization profile, only leaving the flip angle profile unchanged. So changing the auxiliary parameters in SLR actually produces solutions to different pulse design problems, whereas varying the auxiliary parameters in IST produces different solutions to the same pulse design problem. In either case, some additional criteria are needed to determine how the auxiliary parameters should be chosen. The "real" problems of pulse synthesis are therefore:

(a) To choose the auxiliary parameters leading to an RF-envelope, "optimal" for a given application, which produces an approximation to a given magnetization profile; and (b) To provide an algorithm that produces the optimal pulse.

Point (a) entails having an algorithm that can find the pulse, with a given magnetization profile, and an arbitrary specification of the auxiliary parameters. Prior to the work of the present inventors, this problem was unsolved in the MR literature. This "real" problem of pulse synthesis is solved herein and used to synthesize pulses of the type usable for MRI, for example.

In view of the above, there is a need in the art for a pulse generation algorithm that is as efficient as SLR though more flexible and that provides more direct control over the final result in terms of the input data.

SUMMARY OF THE INVENTION

The above-mentioned needs in the pulse synthesis art are addressed by the techniques of the invention. The techniques described herein show the following:

(a) how to construct pulses with a specified magnetization profile and rephasing time. This is in contrast to SLR where only the flip angle profile is specified, and the phase of the transverse magnetization is "recovered."

(b) how to encode the auxiliary parameters so as to regain the full space of solutions to the pulse design problem, known to exist by the inverse scattering approach. The problem of pulse design is thus reduced to solving a family of integral equations known in the mathematics literature as the Marchenko equations.

(c) for a given magnetization profile, how to choose the "auxiliary" parameters in the IST approach to obtain the RF-envelope with the minimum possible energy requirement.

The left Marchenko equation is also introduced to address the numerical difficulties caused by usage of auxiliary parameters. Two different, but equivalent formulations of the inverse scattering problem, are used. This leads to the left and right Marchenko equations. Previously, only the right Marchenko equation had been applied to the problem of RF-pulse design.

Also, the discrete inverse scattering transform (DIST) is explained herein, which provides the unique solution to a discretization of the Marchenko equations, with arbitrarily specified magnetization profile, and auxiliary parameters. The algorithm is quite stable, and as efficient as the standard (very efficient) approach used in SLR. The DIST is a particular discrete approximation of the full inverse scattering transform.

Two approaches to solving the pulse design problem are proposed in accordance with the invention. The first approach uses a straightforward discretization of the continuum model. The second approach uses the hard pulse approximation, as is also done in SLR.

The present invention differs from the SLR approach in that the algorithm of the invention approximates the magnetization profile directly, and not the flip angle profile. The first approach uses a finite sum approximation to the Marchenko equations, while the second approach uses a recursive algorithm that is a different discretization of the Marchenko equation formalism. Both algorithms use the left Marchenko equation to deal with significant numerical instabilities that arise in the presence of bounded states if only the right equation is used. Using the Marchenko equation formalism is believed by the present inventors to be important if one wishes to freely specify the auxiliary parameters, and thereby obtain the full set of solutions to the pulse synthesis problem.

The methods described herein also provide a way to retrospectively analyze existing pulses to see if their energy consumption can be reduced. A variety of tools are provided for adapting the RF-envelope for specific purposes. For example, the method of the invention gives a method to reduce the rephasing time of the pulse, at the expense of a known increase in energy. The method of the invention also provides a method to study the dependence of the magnetization profile on the amplitude of the RF-envelope.

In a presently preferred application of the invention, RF pulses are generated using the techniques of the invention for magnetic resonance imaging and spectroscopy. However, as more sophisticated applications of magnetic resonance are found (e.g. hybrid forms of spatial encoding), and attempts are made to use less homogeneous background fields, the more robust and direct approach to pulse synthesis in accordance with the invention will be preferred to the existing methods. Indeed, these more demanding applications may well require precise control of the phase of the magnetization profile. Such control is attainable using the method of the invention. The analysis of, and solutions to the pulse design, provided by the present invention also apply to any two-level quantum system or subsystem described by the spin domain Bloch equation, such as systems in the emerging field of spintronics and such potential applications as quantum computing where it is also very important to control the phase of the excitation.

BRIEF DESCRIPTION OF THE DRAWINGS

The present invention will be apparent from the following detailed description of the invention taken in conjunction with the accompanying drawings, of which:

FIGS. 1(a)–6(f) illustrate various truncations of a 90°, minimum energy, IST pulse and the magnetization profiles they produced.

FIG. 2 shows a comparison of in-slice versus out-of-slice errors for two methods of pulse design for two different choices of transition width and rephasing time.

FIG. 4(a) illustrates $T_2=10$ ms for a 90° pulse with 2 ms rephasing time, $\delta_2=0.1$ and the transition width is 0.2 KHz.

FIG. 4(b) illustrates $T_2=10$ ms for a 90° pulse with 4 ms rephasing time, $\delta_2=0.01$ and the transition width is 0.15 KHz.

FIG. 6 illustrates a variety of self refocused 90° pulses that were designed by using different rational approximations, r, for the desired reflection coefficient.

FIG. 7(a) illustrates the minimum energy pulse with the given magnetization profile, M.

FIG. 7(b) illustrates the pulse with magnetization profile, M, and a bound state at 0.5i, with norming constant 1.0.

FIG. 7(c) illustrates the pulse with magnetization profile, M, and bound states at 0.5i+1.4, and 1.0i–1.0, with norming constants 1, and –10.

FIG. 7(d) illustrates the pulse with magnetization profile, M, and bound states and i–1, i, and i+1, with norming constants 1, 2 and 1.

FIG. 8(a) shows the minimum energy IST pulse for the Mexican hat example.

FIG. 8(b) shows the transverse magnetization defined by $\psi(\xi)$ for the minimum energy IST pulse of FIG. 8(a).

DETAILED DESCRIPTION OF ILLUSTRATIVE EMBODIMENTS

Figure 3A:
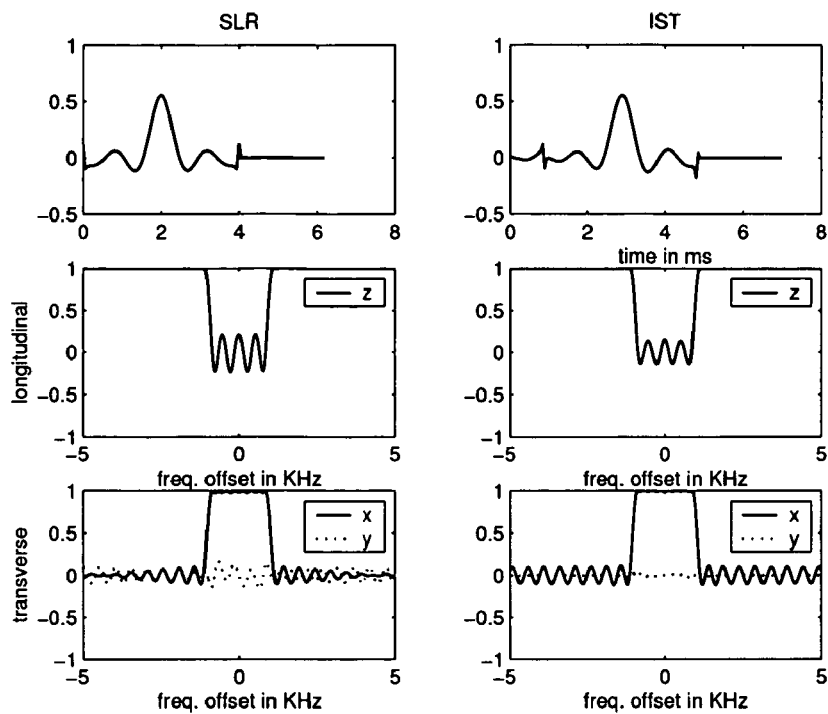
FIG. 3(a) illustrates a 90° pulse with 2 ms rephasing time, $\delta_2=0.1$ and the transition width is 0.2 KHz.

A detailed description of illustrative embodiments of the present invention will now be described with reference to FIGS. 1–8. Although this description provides detailed examples of possible implementations of the present invention, it should be noted that these details are intended to be exemplary and in no way delimit the scope of the invention.

It also should be understood that the methodology disclosed below can be implemented with the aid of software development tools that execute on a computing device. Such software development tools may be embodied in the form of program code (i.e., instructions) stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. The present invention may also be embodied in the form of program code that is transmitted over some transmission medium, such as over electrical wiring or cabling, through fiber optics, over a network, including the Internet or an intranet, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Overview

The present invention relates to a practical implementation of a method for selective RF-pulse synthesis by solving the inverse scattering problem.

In particular, given the reduced scattering data $\{r(\xi), \xi \in \mathcal{R}; (\xi_1, C_1), \ldots, (\xi_N, C_N)\}$, with $\xi_i \neq \xi_j$, the following function may be defined:

$$f(t) = \frac{1}{2\pi}\int_{-\infty}^{\infty} r(\xi)e^{i\xi t}\,d\xi - i\sum_{j=1}^{N} C_j e^{i\xi_j t}. \qquad (41)$$

This is the inverse Fourier transform of $r(\xi)$ with a correction added to account for the bound states. The finite sum in Equation (41) is exponentially decreasing as t tends to $+\infty$.

For each $t \in \mathcal{R}$; the operator $F_t$ may be defined by:

$$F_t h(s) = \int_t^{\infty} f(s+y)h(y)\,dy \quad \text{for } s \in [t, \infty). \qquad (42)$$

One may denote the adjoint of $F_t$, as an operator on $L^2([t, \infty))$, by $F_t^*$. For each $t \in (-\infty, \infty)$ the (right) Marchenko equation is the integral equation, for a function $k_t(s)$ defined for $s \in [t, \infty)$, given by:

$$[(Id + F_t^* F_t)k_t](s) = f^*(t+s), \qquad (43)$$

or more explicitly:

$$k_t(s) + \int_t^{\infty}\left[\int_t^{\infty} f^*(s+y)f(y+x)\,dy\right]k_t(x)\,dx = f^*(t+s). \qquad (44)$$

The solution of the inverse scattering problem is given in the following theorem:

Theorem 3. Given a smooth, rapidly decaying reflection coefficient $r(\xi)$, and a finite set of pairs $\{(\xi_j, C_j): j=1, \ldots, N\}$, with the $\{\xi_j\}$ distinct, $\text{Im } \xi_j > 0$ and $C_j \neq 0$, for $j=1, \ldots, N$, Equation (43) has a unique solution for every $t \in \mathcal{R}$. If:

$$q(t) = -2k_t(t). \qquad (45)$$

then the ZS-system, with this potential, has reflection coefficient r. It has exactly N bound states at frequencies $\{\xi_1, \ldots, \xi_N\}$, and the relations of Equation (24) hold at these points.

As noted above, r=b/a; given r; and the locations of the bound states, Equation (26). May be used to determine a, and therefore b. For $\xi \in \mathcal{R}$, define:

$$\tilde{r}(\xi) = \frac{b^*(\xi)}{a(\xi)}, \qquad (46)$$

and let $\{\xi_1, \ldots, \xi_N\}$ be the zeros of a in the upper half plane. The kernel function for the left Marchenko equation is defined by:

$$g(t) = \frac{1}{2\pi} \int_{-\infty}^{\infty} \tilde{r}(\xi) e^{-i\xi t} dt - i \sum_{j=1}^{N} \tilde{C}_j e^{-i\xi_j t}, \qquad (47)$$

where the coefficients $\{\tilde{C}_j\}$ are given by:

$$\tilde{C}_j = \frac{1}{C_j |a'(\xi_j)|^2}. \qquad (48)$$

The finite sum of exponentials in Equation (47) decays as t tends to $-\infty$. The values $\{a'(\xi_j)\}$ are easily computed using Equation (26), implying that:

$$a'(\xi_k) = \frac{1}{\xi_k - \xi_k^*} \prod_{j \neq k} \left( \frac{\xi_k - \xi_j}{\xi_k - \xi_j^*} \right) \exp\left[ \frac{i}{2\pi} \int_{-\infty}^{\infty} \frac{\log(1 + |r(\zeta)|^2) d\zeta}{\zeta - \xi_k} \right]. \qquad (49)$$

If the bound states are close together, then $|a'(\xi_k)|^2$ may become quite small; this, in turn, makes $\tilde{C}_j$ quite large. So even though the exponentials in Equation (47) decay rapidly as $t \to -\infty$ the finite sum in Equation (47) can be very large for t near to zero.

For each $t \in \mathbb{R}$ define an operator from $L^2((-\infty,t])$ to itself by:

$$G_t l(s) = \int_{-\infty}^{t} g(s+y) l(y) dy. \qquad (50)$$

For each $t \in \mathbb{R}$, the left Marchenko equation is:

$$[(Id + G_t G^*_t) l_t l](s) = -g(s+t), \text{ for } s \in (-\infty, t], \qquad (51)$$

or more explicitly:

$$l_t(s) + \int_{-\infty}^{t} \left[ \int_{-\infty}^{t} g(s+y) g^*(y+x) dy \right] l_t(x) dx = -g(s+t). \qquad (52)$$

If $l_t(s)$ solves this equation, then the potential defined by:

$$q(t) = 2 l_t(t), \qquad (53)$$

has reflection coefficient $r(\xi)$, It has exactly N bound states located at frequencies $\{\xi_1, \ldots, \xi_N\}$, and the relations in Equation (24) hold at these points.

The input to the IST pulse design process in accordance with the invention is an ideal magnetization profile, $m^\infty(v)$ which, via Equation (33), defines an ideal reflection coefficient $r_i(\xi)$. Frequently, the ideal reflection coefficient is a discontinuous function. The following five step procedure will provide a general class of solutions to the inverse scattering problem.

1. The first step in IST pulse synthesis is to choose a smooth function with bounded support, $r_d(\xi)$ which is an approximation to $r_i(\xi)$. So far as the algorithm is concerned, the choice of approximation, $r_d(\xi)$, is constrained only by the need to have its Fourier transform, $\hat{r}_d(t)$, decay reasonably quickly. There is no need to use any special type of function such as a rational or meromorphic function. As with SLR pulse design the "transition width" and ripple directly effect the duration of the final pulse.
2. The next step is to choose the locations of the bound states and the norming constants, $\{(\xi_i, C_i, i=1, \ldots, N\}$. For a minimum energy pulse, no bound states are used. For a self refocused pulse, $r_d(\xi)$ is usually taken to be a rational function. The $\{\xi_j\}$ are then the poles of $r_d(\xi)$ in the upper half plane, and the $\{C_j\}$ are the residues of $r_d(\xi)$ at these poles.
3. Given the data $\{r_d(\xi); (\xi_1, C_1), \ldots, (\xi_N, C_N)\}$, the left reflection coefficient and left norming constants are determined, using Equations (46) and (48), respectively. With this data, one can determine the kernel functions, f and g; for the right and left Marchenko equations, using Equations (41) and (47), respectively. In practice, these functions are computed at sample points by using the Finite Fourier Transform (EFT). The functions $M_f(t)$ and $M_g(t)$ are computed using, for example the functions:

$$M_f(t) = \sup_{s \geq t} |f(s)|, \quad I_f(t) = \int_t^\infty |f(s)| ds \qquad (54)$$

$$M_g(t) = \sup_{s \leq t} |g(s)|, \quad I_g(t) = \int_{-\infty}^t |g(s)| ds.$$

and the "switching" time $\tau_0$ is determined as the unique solution to the equation $M_f(\tau_0) = M_g(\tau_0)$.

4. The left and right Marchenko equations are approximately solved to determine $\{q_d(t_j)\}$ at sample points $(t_j)$ belonging to a sufficiently large interval $[t^-, t^+]$. This interval should contain the effective support of $q_d(t)$ which can be determined, a priori, by using the estimates:

$$|q(t)| \leq \frac{2 M_f(2t)}{1 - I_f^2(2t)} \text{ or } |q(t)| \leq \frac{2 M_g(2t)}{1 - I_g^2(2t)}. \qquad (55)$$

The right equation is used for $t_j \geq \tau_0$ and the left equation for $t_j < \tau_0$. The fineness of the sample spacing, $\Delta$, is determined by the range of offset frequencies present in the sample. As is well known, using a sum of boxcar pulses of duration $\Delta$ to approximate $q_d(t)$ produces sidelobes in the magnetization profile at intervals of length $2\Delta^{-1}\pi$.

5. The duration of the pulse produced by the IST (i.e., the effective support of $q_d(t)$) may exceed what is allowable in the given application. In this case the pulse is truncated, and usually windowed with a smoothing function, e.g. $\cos^2(B(t-t_0))$. This leads to changes in the excitation profile, usually a decrease in selectivity as well as phase errors, as shown in FIG. 1. FIGS. 1(a)–1(c) illustrate various truncations of a 90°, minimum energy, IST pulse and the magnetization profiles produced for sharp truncation by 0.001% criterion (FIG. 1(a)), sharp truncation by 1% criterion (FIG. 1(b)), and smooth truncation by 1% n criterion (FIG. 1(c)). The transverse magnetizations produced by the truncations of FIGS. 1(a)–(c)) are illustrated in FIGS. 1(d)–1(f), respectively. Sometimes a better result is obtained by starting over, replacing $r_d(\xi)$ by a "smoother" function, i.e. a function with a wider transition region.

The approach of the invention is a particular discrete approximation of the full inverse scattering transform (IST) approach described above which is, in a sense, a full implementation of the hard pulse approximation within the inverse scattering approach. In the discrete inverse scattering transform (DIST) approach of the invention, the choice of $r_d(\xi)$ is further constrained to be of the form:

$$r(w) = \sum_{j=1-\rho}^{\infty} \vec{r}(j) w^j. \tag{56}$$

As in the SLR approach, the present invention uses a hard pulse approximation, directly designing an RF-envelope of the form:

$$q_\Omega(t) = \sum_{j=-\infty}^{\infty} \omega_j \delta(t - j\Delta). \tag{57}$$

Each algorithm is then a two step process:
Step 1: Approximate the "ideal" magnetization profile by a periodic function from a specified class.
Step 2: Using the result of step 1, find a hard pulse which produces the given approximation to the magnetization profile.

In practical applications, a "softened" version of $q_\Omega$ is actually implemented. For example, one might actually use:

$$q_{s\Omega}(t) = \sum_{j=-\infty}^{\infty} \frac{\omega j}{\Delta} \chi_{(0,\Delta)}(t - j\Delta).$$

In order for the softened pulse to produce a magnetization profile close to that produced by $q_\Omega$, it is necessary that the coefficients $\{\omega_j\}$ be uniformly small. As these coefficients are $o(\Delta)$, this reduces to the requirement that the time step, $\Delta$, be sufficiently small. This is what is often called the hard pulse approximation.

The scattering formalism used to analyze the spin domain Bloch equation, with a reasonably smooth potential, has a well defined limit for a potential of the form given in Equation (57). One obtains a scattering operator, which can be written in the form:

$$s_\Omega(z) = \begin{bmatrix} a(z) & -b^*(z) \\ b(z) & a(z) \end{bmatrix}. \tag{58}$$

The physical frequency, z, is twice the spin domain frequency, i.e., $z=2\xi$. For a hard pulse, the coefficients, a(z) and b(z) are periodic functions of period $\Delta^{-1}2\pi$, and therefore can be expressed as functions of $w=e^{iz\Delta}$.

The first step in the SLR approach is to find a polynomial in w that approximates the flip angle profile, essentially |b(w)|. A common technique is to use the Chebyshev or equiripple approximant, found using a Remez algorithm. This then leads to polynomials (a(w), b(w)). In accordance with the invention, the reflection coefficient defined to be:

$$r = \frac{b}{a}. \tag{59}$$

and is used directly. The magnetization profile $M(z)=[M_x(z), M_y(z), M_z(z)]'$ determines, and is determined by r as follows:

$$m(z) = \begin{bmatrix} \frac{2\Re r}{1+|r|^2} \\ \frac{2\Re r}{1+|r|^2} \\ \frac{1-|r|^2}{1+|r|^2} \end{bmatrix}. \tag{60}$$

For step 1, a Remez type algorithm may be used to find a Chebyshev approximation for r. This is a very important difference between the approach of the invention and the SLR approach. By approximating r, rather than |b|, the technique of the invention retains control on the phase of the final magnetization profile. To some extent, the technique of the invention sacrifices direct control on the duration of the pulse. To be more precise: while the full duration of the pulse is not specified in advance, the technique of the invention does control the rephasing time of the designed pulse. In practice, the rephasing time is usually close to the length of the part of the pulse after the peak. It is during this part of the pulse that there is a significant transverse component, which is, in turn, is subject to the spin-spin ($T_2$) relaxation process. In practice, the pulses designed using the IST approach have only a slightly longer duration than the SLR pulse with comparable design parameters. Generally, the IST pulse produces a markedly cleaner, and more accurate magnetization profile.

In the SLR approach, a very efficient recursive algorithm is used to determine the hard pulse from the polynomial approximations to a and b. However, there are, in fact, many choices for (a, b), producing different pulses, which nonetheless generate the same magnetization profile. In the inverse scattering language the additional data are called "bound states." The bound states arise only implicitly in the SLR formalism. Moreover, in the SLR approach, the introduction of bound states changes the phase of the transverse magnetization, preserving only the flip angle profile.

Accordingly, as step 2 of the algorithm of the invention, a different, very efficient recursion is used that generates the pulse from the reflection coefficient and the data connected to the bound states. In this approach, the bound states are auxiliary data, which do not change the magnetization profile. They capture the true nonuniqueness of the solution to the pulse design problem. The recursion of the invention is philosophically quite different from the SLR recursion, and is, instead, inspired by the Marchenko equation formalism used in continuum inverse scattering theory.

The introduction of bound states often leads to ill conditioned problems, with exponentially growing condition number. An important aspect of the approach of the invention is that it uses both the left and right Marchenko equations. While ill conditioned systems still arise, they remain amenable to numerical solution.

To summarize, the approach of the invention differs from SLR in three basic ways:

(a) The invention obtains an approximation to the magnetization profile, rather than the flip angle profile.

(b) The invention does not directly control the duration of the pulse but does control the rephasing time, and this is adequate for most applications. In practice, the 1ST pulses have durations that are comparable to SLR pulses with similar design parameters.

(c) The invention uses a different recursion to construct the pulse from the scattering data, that is r and the bound states. This recursion allows for the arbitrary specification of the data connected to bound states.

The present patent application is organized as follows. The next section introduces concepts and notation connected to the analysis of hard pulses. The following section explains what sort of magnetization profiles can be obtained using hard pulses under various constraints. The approach to approximating the magnetization profile is then explained. In the following sections, the derivation of the discrete version of the left and right Marchenko equations is explained, and the recursive algorithms used to construct the pulse are explained. After deriving the algorithm, a variety of examples are given.

Preliminary Definitions and Notations

This section presents some notation used herein. Though the Bloch equation is not discussed explicitly, all calculations herein are done implicitly in a rotating reference frame.

Precession and rotation operators. If one considers a magnetization state $\mathcal{M}: \mathbb{R} \to \mathbb{R}^3$ to be a unit vector valued function of the offset frequency $z \in \mathbb{R}$ (measured in radians per unit of time) with values in $\mathbb{R}^3$, then $\mathcal{M}$ denotes the vector space of all such functions. $\mathfrak{R}$ denotes the space of smooth functions from $\mathbb{R}$ to SO (3), the group of rigid rotations.

An element $O(z)$ of $\mathfrak{R}$ acts on an element $M(z)$ of $\mathcal{M}$ by the rule:

$$O \cdot M(z) = O(z)M(z).$$

Two families of elements of $\mathfrak{R}$ may be defined For $t \in \mathbb{R}$ let $P_t: \mathcal{M} \to \mathcal{M}$ denote free precession for t units of time:

$$P_t M = \begin{bmatrix} \Re e^{itz} & \Im e^{itz} & 0 \\ \Im e^{itz} & \Re e^{itz} & 0 \\ 0 & 0 & 1 \end{bmatrix} M. \tag{61}$$

For $\omega \in \mathcal{C}$ let $$R_\omega: \mathcal{M} \to \mathcal{M}$$

denote a rotation of $|\omega|$ radians around the $$[\Re \quad \Im \quad 0]^t\text{-axis}.$$

-axis.

For simplicity, a matrix representation for $R_\omega$ is not given at this stage, but unlike $P_t$, the operator $R_\omega$ does not have a z-dependence.

Scattering theory. A hard pulse $\Omega: \mathbb{Z} \to \mathcal{C}$ is defined to be a doubly infinite sequence of complex numbers. If one is interested in a pulse of finite duration, then it is required that $\omega_j = \Omega(j)$ be non-zero for only finitely many values of j. In this case, the index of the first entry after the last non-zero entry signifies the number of rephasing time steps which should be performed immediately following the application of the pulse. More explicitly, suppose that $\omega_{p-N}, \ldots, \omega_{p-1}$ are the non-zero entries of $\Omega$. Then $\Omega$ is a hard pulse of duration N with p rephasing time steps. After rephasing, the equilibrium magnetization state is rotated to $$M_\Omega := P_{-p\Delta} P_\Delta R_{\omega_{p-1}} \cdots P_\Delta R_{\omega_{p-N+1}} P_\Delta R_{\omega_{p-N}} \begin{bmatrix} 0 \\ 0 \\ 1 \end{bmatrix}. \tag{62}$$

Here $\Delta > 0$ is the time step, and $P_{-p\Delta}$ is the rephasing operation. The function $M_\Omega$ is called the magnetization profile for $\Omega$.

For theoretical purposes, it is useful to define $M_\Omega$ for certain hard pulses, which are not necessarily of finite duration. A hard pulse $\Omega$ is admissible if, for each $j \in \mathbb{Z}$, there exist elements of $\mathfrak{R}$, $T_{+,j}(\omega)$, $T_{-,j}(\omega)$, with certain analyticity properties that satisfy the recursion:

$$T_{\pm,j+1} = P_\Delta R_{\omega_j} T_{\pm,j}. \tag{63}$$

and normalize by:

$$\lim_{j \to \pm\infty} T_{\pm,j} P_{-j\Delta} = Id. \tag{64}$$

Finite duration pulses are always admissible. Generally speaking a pulse is admissible if it decays rapidly enough as $j \to \pm\infty$.

For admissible $\Omega$:

$$S_\Omega := T_{+,j}^{-1} T_{-,j} \text{ for any } j \in \mathbb{Z},$$

and $$M_\Omega := S_\Omega \begin{bmatrix} 0 \\ 0 \\ 1 \end{bmatrix}.$$

The expression $$T_{+,j}^{-1} T_{-,j}$$

is independent of j because $$T_{+,j+1}^{-1} T_{-,j+1} = T_{+,j}^{-1} R_{\omega_j}^{-1} P_\Delta^{-1} P_\Delta R_{\omega_j} T_{-,j} = T_{+,j}^{-1} T_{-,j}.$$

If $\omega_j = \Omega(j)$ vanishes outside the interval $[\rho-N, \rho)$, as above, then Equation (64) implies that $T_{+,j} = P_{j\Delta}$ for all $j \geq p$ and that $T_{-j}=P_{jΔ}$ for all $j≦ρ-N$. Therefore, $S_Ω=P_{-ρΔ}T_{-,ρ}$. Now using the recursion (15):

$$S_Ω=P_{-ρΔ}P_{ΔR_{ωρ-1}} \ldots P_ΔR_{ωρ-N+1}P_ΔR_{ωρ-N}P_{(ρ-N)Δ},$$

which implies that the new definition of $M_Ω$ is consistent with the original definition in the finite duration case (note that $P_{(ρ-N)Δ}$ fixes the equilibrium magnetization).

The operator $S_Ω$ is called the scattering operator, and the map $Ω↦S_Ω$ is called the scattering transformation. Since the scattering operator specifies the magnetization profile as a function of the offset frequency, the problem of selective excitation pulse synthesis is the problem of inverting the scattering transformation. There is a direct analogy between the matrix valued functions $\{T_{±j(ω)}\}$, and the normalized solutions, $ψ±(z;t)$, to the spin domain Bloch equations. The scattering operator defined above is then a direct analogue of the scattering operator for the Bloch equation, which is defined as:

$$s(z)=ψ_+(z;t)^{-1}ψ_-(z;t).$$

This operator is also independent of t.

The projection operators $Π_+$ and $Π_-$. Define w: $\mathbb{R}→S^1$ by $w(z)=e^{izΔ}$, so that every function f in $L^2(S^1)$ can be written in terms of its Fourier series:

$$f = \sum_{n=-\infty}^{\infty} f_n w^n.$$

The notation $\mathcal{F}(f)(n)$ may be used to denote $f_n$, the nth Fourier coefficient of f.

Let $Π_+: L^2(S^1)→H^+(S^1)$ and $Π_-: L^2(S^1)→H^-(S^1)$ be the projections defined by:

$$Π_+\left(\sum_{n=-\infty}^{\infty} f_n w^n\right) = \sum_{n=1}^{\infty} f_n w^n$$

$$Π_-\left(\sum_{n=-\infty}^{\infty} f_n w^n\right) = \sum_{n=-\infty}^{-1} f_n w^n,$$

and let $\tilde{Π}_+: L^2(S^1)→\tilde{H}^+(S^1)$ and $\tilde{Π}_-: L^2(S^1)→\tilde{H}^-(S^1)$ be the projections defined by $$\tilde{Π}_+\left(\sum_{n=-\infty}^{\infty} f_n w^n\right) = \frac{1}{2}f_0 + \sum_{n=1}^{\infty} f_n w^n$$

$$\tilde{Π}_-\left(\sum_{n=-\infty}^{\infty} f_n w^n\right) = \frac{1}{2}f_0 + \sum_{n=-\infty}^{-1} f_n w^n.$$

Notice that $\tilde{H}^+ \subset L^2(S^1)$ consists of the functions which extend to be analytic function of ω in the unit $ω\text{-}disk$ $\mathbb{D}$.

The operator $Π_ζ$. Suppose that F is meromorphic in $U \subset \mathcal{C}$, with a pole at $ζ_0$. The function has a unique representation of the form:

$$F(ω) = \sum_{j=1}^{N} \frac{a_j}{(ω-ζ_0)^j} + h(ω). \quad (65)$$

Here h(ω) is a meromorphic function in U, which is analytic in a neighborhood of $$ζ_0. \quad p_{ζ_0}^{F'}$$

denotes the finite sum of singular terms in Equation (65). Suppose now that f(ω) is a function in $L^2(S^1)$ with a meromorphic extension F to the unit disk. If $ζ=\{ζ_1, \ldots, ζ_m\}$ is a subset of $\mathbb{D}$, then the function F has a unique representation of the form:

$$F(ω) = \sum_{j=1}^{m} p_{ζ_1}^F(ω) + h(ω), \quad (66)$$

with h(ω) is a meromorphic function in $\mathbb{D}$, which is analytic in a neighborhood of each $ζ_j$. $Π_ζ f \in L^2(S^1)$ is defined by:

$$Π_ζ f = \sum_{j=1}^{m} p_{ζ_1}^F(ω)\bigg|_{S^1}. \quad (67)$$

If ζ is written as the disjoint union of two subsets ζ', ζ", then:

$$Π_ζ f = Π_{ζ'} f + Π_{ζ''} f.$$

Using the Laurent expansion it is easy to see that $Π_ζ f = Π_- Π_ζ f$.

The following lemma is used several times:

Lemma 1. Let $f \in L^2(S^1)$ have a meromorphic extension, F, to the unit disk, and let ζ be a finite subset of $\mathbb{D}$. If the poles of F lie in the set ζ, then $Π_ζ f = Π_- f$. If $g \in \tilde{H}^+(S^1)$, then $$Π_ζ(fg) = Π_-[g(Π_ζ f)]. \quad (68)$$

Proof. The first claim follows easily from Equation (67), and the Laurent expansion for $(w-ζ_j)^{-j}$, for $j \in \mathbb{N}$. For the second claim, it suffices, by linearity, to consider $F(w)=(ω-ζ_0)^{-j}$. Let G denote the holomorphic extension of g to $\mathbb{D}$. At $ζ_0$ one gets the representation:

$$G(ω) = \sum_{k=0}^{j-1} a_k(ω-ζ_0)^k + (ω-ζ_0)^j H(ω),$$

where H is holomorphic in the disk. Then:

$$Π_{ζ_0}(fg)(e^{iθ}) = \sum_{k=0}^{j-1} a_k(e^{iθ}-ζ_0)^{k-j}.$$

This clearly equals $Π_-[g(Π_{ζ_0} f)]$.

Realizable Magnetization Profiles

This section considers which magnetization profiles are realizable with a hard pulse. This problem has been solved by Shinnar et al. in "Inversion of the Bloch Equation," J. Chem. Phys., Vol. 98 (1993), pp. 6121–6128, for hard pulses of fixed finite duration.

First, the Shinnar-Leigh result describing the magnetizations that are attainable using a finite duration pulse are provided. Next, pulses of infinite duration, but finite rephasing time are considered, and the reflection coefficient is introduced. Finally, infinite duration pulses with infinite rephasing time are discussed.

Finite duration pulses. Parts of this theorem are proved below within the framework of inverse scattering.

Theorem 4. Let $\Omega$ be a finite duration pulse. Then there exist functions:

$$a = \sum_{j=0}^{N-1} a_j \omega^j \quad (69, 70)$$

$$b = \sum_{j=1-\rho}^{N-\rho} b_j \omega^j,$$

with $$a_0 > 0 \quad (71)$$

and $$|a|^2 + |b|^2 = 1 \text{ on the unit } w\text{-circle}, \quad (72)$$

such that $$S_\Omega = \begin{bmatrix} \mathcal{R}[(a^*)^2 + b^2] & \mathcal{F}[(a^*)^2 - b^2] & 2\mathcal{F}a^*b \\ -\mathcal{F}[(a^*)^2 + b^2] & \mathcal{R}[(a^*)^2 - b^2] & 2\mathcal{R}a^*b \\ -2\mathcal{F}ab & -2\mathcal{R}ab & |a|^2 - |b|^2 \end{bmatrix} \quad (73, 74)$$

$$M_\Omega = \begin{bmatrix} 2\mathcal{F}a^*b \\ 2\mathcal{R}a^*b \\ |a|^2 - |b|^2 \end{bmatrix}.$$

Conversely, if a and b are any functions of the form of Equations (69) and (70), satisfying Equations (71) and (72), then there exists a pulse $\Omega$ of duration N, and rephasing time $\rho$ such that $S_\Omega$ and $M_\Omega$ are given by Equations (73) and (74).

In the spin domain formulation, the action of the real 3×3 matrix in Equation (73) corresponds to the conjugation of $$su_2 \simeq \mathbb{R}^3 \text{ by } \begin{bmatrix} a & -b^* \\ b & a^* \end{bmatrix}.$$

Infinite duration pulses with finite rephasing. Let $\Omega: \mathbb{Z} \to \mathbb{C}$ be a hard pulse, and let $\rho \in \mathbb{Z}$. As before, $\Omega$ has $\rho$ rephasing time steps if $\omega_j = \Omega(j)$ vanishes for all $j \geq \rho$. The following theorem provides an answer to the question of which profiles $M_\Omega$ are realizable by a pulse with $\rho$ rephasing steps, in terms of the data (a, b). A more useful answer is given in Theorem 6.

Theorem 5. Suppose that $$a = \sum_{j=0}^{\infty} a_j \omega^j \quad (75, 76)$$

$$b = \sum_{j=1-\rho}^{\infty} b_j \omega^j,$$

are functions in $L^2(S^1)$ satisfying $|a|^2 + |b|^2 = 1$ and $a_0 > 0$. It is also assumed that a has finitely many zeros in the unit disk, that a and b have no common zeros in the unit disk, and that $$\frac{1}{a}$$

is bounded on $S^1$. Then, there exists a hard pulse $\Omega$ with $\rho$ rephasing time steps such that $$S_\Omega = \begin{bmatrix} \mathcal{R}[(a^*)^2 + b^2] & \mathcal{F}[(a^*)^2 - b^2] & 2\mathcal{F}a^*b \\ -\mathcal{F}[(a^*)^2 + b^2] & \mathcal{R}[(a^*)^2 - b^2] & 2\mathcal{R}a^*b \\ -2\mathcal{F}ab & -2\mathcal{R}ab & |a|^2 - |b|^2 \end{bmatrix}$$

$$M_\Omega = \begin{bmatrix} 2\mathcal{F}a^*b \\ 2\mathcal{R}a^*b \\ |a|^2 - |b|^2 \end{bmatrix}.$$

The Reflection Coefficient. Let a and b be as in Theorem 5, and let $\Omega$ be the corresponding hard pulse. The function r=

$$r = \frac{b}{a}$$

is called the reflection coefficient. On the unit circle, $$|a|^2 = \frac{1}{1 + |r|^2} \text{ and } |b|^2 = \frac{|r|^2}{1 + |r|^2}.$$

From this one can compute:

$$2a^*b = 2|a|^2 \frac{b}{a} = \frac{2r}{1 + |r|^2}.$$

$$|a|^2 - |b|^2 = \frac{1 - |r|^2}{1 + |r|^2}.$$

Therefore $M_\Omega$ can be written in terms of r as:

$$M_\Omega = \begin{bmatrix} \mathcal{F}\dfrac{2r}{1 + |r|^2} \\ \mathcal{R}\dfrac{2r}{1 + |r|^2} \\ \dfrac{1 - |r|^2}{1 + |r|^2} \end{bmatrix}.$$

In fact one can specify the single function r, for a and b can be recovered from the reflection coefficient, and the locations and multiplicities of the zeros of a. Let $\zeta_1, \ldots, \zeta_m \in \mathbb{D}$ be the zeros of a in the unit disk with multiplicities $d_1, \ldots, d_m \in \mathbb{N}$, and set:

$$\tilde{a} = \prod_{k=1}^{m} \left( \frac{|\zeta_k|}{\zeta_k} \cdot \frac{\zeta_k - \omega}{1 - \zeta_k^* \omega} \right)^{-d_k} a_1$$

so that $\tilde{a}$ is analytic and non-vanishing in $\mathbb{D}$. This implies that $\log \tilde{a}$ is analytic in $\mathbb{D}$. On the unit circle:

$$|\tilde{a}| = |a| = (1 + |r|^2)^{-1/2}$$
$$\log|\tilde{a}| = -\frac{1}{2}\log(1 + |r|^2).$$

Because $\tilde{a}$ is analytic:

$$\log \tilde{a} = -\tilde{\Pi}_+ \log(1+|r|^2).$$

Therefore, a can be expressed in terms of r:

$$a = \prod_{k=1}^{m} \left( \frac{|\zeta_k|}{\zeta_k} \cdot \frac{\zeta_k - \omega}{1 - \zeta_k^* \omega} \right)^{d_k} \exp(-\tilde{\Pi}_+ \log(1 + |r|^2)). \quad (77)$$

Then b can be obtained as the product:

$$b = ar. \quad (78)$$

If a vanishes at the points $\{\zeta_1, \ldots, \zeta_m\}$ then, by analogy with the continuum case, there are bound states located at these points.

If one starts with an arbitrary reflection coefficient $r \in L^\infty(S^1)$ and a finite set of points $\{\zeta_j\} \subset \mathbb{D}$, and positive integers $\{d_j\}$, then there is no reason to expect the resulting function b to be of the form of Equation (76). The following Theorem gives criteria, which the reflection coefficient should satisfy, in order to require a given number of rephasing time steps.

Theorem 6. Consider the data $(r; \zeta_1, \ldots, \zeta_m; d_1, \ldots, d_m)$ for $r \in L^\infty(S^1)$, $\zeta_j \in \mathbb{D}\setminus\{0\}$, and $d_j \in \mathbb{N}$. Let:

$$a = \sum_{j=0}^{\infty} a_j \omega^j$$

$$b = \sum_{j=-\infty}^{\infty} b_j \omega^j$$

be the functions obtained using Equations (77) and (78). Then a and b satisfy the hypothesis of Theorem 5 if and only if $rw^{\rho-1}$ is meromorphic in the unit disk with poles at $\zeta_1, \ldots, \zeta_m$ and multiplicities $d_1, \ldots, d_m$.

Proof. Suppose that a and b satisfy the hypotheses of Theorem 5. Then $b_j = 0$ for all $j \leq -\rho$, so that $bw^{\rho-1}$ is analytic in the unit disk. Therefore, $$rw^{\rho-1} = \frac{bw^{\rho-1}}{a}$$

is meromorphic in the unit disk. Clearly, $rw^{\rho-1}$ has the same poles and multiplicities as $$\frac{1}{a}$$

since a and b are assumed to have no common zeros.

Conversely suppose that $rw^{\rho-1}$ is meromorphic in the unit disk with the same poles and multiplicities as $$\frac{1}{a}.$$

Then $bw^{\rho-1} = arw^{\rho-1}$ is clearly analytic in the unit disk, which implies that $b_j = 0$ for all $j \leq -\rho$. The other hypotheses of Theorem 5 are easily verified.

Theorem 5 may now be expressed in terms of the reflection coefficient: Suppose that r is a bounded function in $L^2(S^1)$, and suppose that $rw^{\rho-1}$ is meromorphic in the unit disk with finitely many poles, and analytic at the origin. Then, there exists a hard pulse $\Omega$ with $\rho$ rephasing time steps such that:

$$M_\Omega = \begin{bmatrix} \mathcal{F}\dfrac{2r}{1+|r|^2} \\ \mathcal{R}\dfrac{2r}{1+|r|^2} \\ \dfrac{1-|r|^2}{1+|r|^2} \end{bmatrix}.$$

Finite rephasing time is a rather restrictive condition. Indeed Theorem 4 indicates that for pulses with a fixed, finite rephasing time, the map $\Omega \to M_\Omega$ is essentially injective. By way of contrast, if one allows infinite rephasing time, then by introducing bound states, one can find an infinite dimensional space of pulses which produce a given magnetization profile. Theoretically, all but one choice of data prescribing bound states, with specified locations, therefore lead to pulses with infinite rephasing time. However, these pulses decay exponentially fast as $j \to \infty$. Practically speaking, this means that if one truncates such a pulse to have a finite, but sufficiently large rephasing time, then it produces a very small change in the magnetization profile. The choice of data prescribing the bound states determines how much rephasing time is needed. Hence as a practical matter, there are many different pulses that produce the same magnetization profile, to within a specified error, and require the same number of rephasing steps.

It is important not to confuse the magnetization profile, $M_\Omega$, with the flip angle profile, $2\arcsin|b|$. In SLR, one can obtain finitely many different pulses with the same flip angle profile, and rephasing time, by reflecting the zeros of a across the unit circle. However, these pulses have different reflection coefficients, and therefore give different resulting magnetizations.

Choosing a Magnetization Profile

This section considers how to approximate the magnetization profile. At the outset, the ideal magnetization profile is a function defined on $\mathbb{R}$. In all applications to MR, the profile agrees with the equilibrium state outside a finite interval. Since the invention approximates the magnetization profile, or data derived from it, by a periodic function, an interval of offset frequencies, $[z_0, z_1]$, is selected that is large enough to contain all frequencies that arise in the application. The magnetization profile is then considered on $[z_0, z_1]$ as one period of a periodic function. The time step $\Delta$ must be chosen small enough so that $z_1 - z_0 \leq \Delta^{-1} 2\pi$.

Specifying a finite duration pulse. As noted above, designing a pulse, $\Omega$, of duration N, with $\rho$ rephasing time steps, is reduced to specifying functions:

$$a = \sum_{j=0}^{N-1} a_j w^j$$

$$b = \sum_{j=1-\rho}^{N-\rho} b_j w^j,$$

with $a_0 > 0$, and $|a|^2 + |b|^2 = 1$. The corresponding magnetization profile is:

$$M_\Omega = \begin{bmatrix} M_x \\ M_y \\ M_z \end{bmatrix} = \begin{bmatrix} 2\mathcal{F} a^* b \\ 2\mathcal{R} a^* b \\ |a|^2 - |b|^2 \end{bmatrix}.$$

In SLR, the standard method for determining polynomials a and b, which satisfy $|a|^2 + |b|^2 = 1$, is to first specify $1 - 2|b|^2$ with $|b| < 1$ as an approximation to $M_z$. Usually, the approximation to b itself is a linear phase function with magnitude given by $|b|$. In order to obtain a minimum energy pulse one then sets:

$$a = \exp(\tilde{\Pi}_+ \log(1 - |b|^2)).$$

This resulting function a is necessarily a polynomial of degree N−1, satisfying $|a|^2 + |b|^2 = 1$. The polynomials a and b can then be replaced by other polynomials by reflecting some of the zeros across the unit circle (so that $|a|$ and $|b|$ remain unchanged). In this method, one only has direct control of the z-component of the resulting magnetization profile. However, direct control on the phase of the profile is sacrificed, in exchange for control on the duration. In many applications the phase errors implicitly introduced by approximating $|b|$ instead of b are close to linear within the "passband," and can therefore be reduced by rephasing.

Specifying an infinite duration pulse with finite rephasing time. As noted above, in order to design a hard pulse $\Omega$ with $\rho$ rephasing time steps, one can specify a reflection coefficient $r \in L^\infty(S^1)$, with the property that $rw^{\rho-1}$ is meromorphic in $\mathbb{D}$ with finitely many poles, and analytic at the origin. If there are no bound states, then the Fourier series of r takes the form of Equation (56):

$$r(\omega) = \sum_{j=1-\rho}^{\infty} \hat{r}(j) w^j.$$

The resulting magnetization is:

$$M_\Omega = \begin{bmatrix} M_x \\ M_y \\ M_z \end{bmatrix} = \begin{bmatrix} \mathcal{F} \dfrac{2r}{1+|r|^2} \\ \mathcal{R} \dfrac{2r}{1+|r|^2} \\ \dfrac{1-|r|^2}{1+|r|^2} \end{bmatrix}.$$

One may now solve for r in terms of $M_x$, $M_y$, and $M_z$:

$$\frac{r}{|r|} = \frac{M_y + iM_x}{|M_y + iM_x|}$$

$$|r| = \sqrt{\frac{1 - M_z}{1 + M_z}}$$

$$r = \frac{M_y + iM_x}{|M_y + iM_x|} \sqrt{\frac{1-M_z}{1+M_z}} = \frac{M_y + iM_x}{1 + M_z}.$$

By specifying r, instead of $|b|$, one retains control of the entire magnetization profile. In fact one can use essentially the same method for approximating r as is used to obtain $|b|$. Specifying the degree of the polynomial approximating r determines the number of rephasing steps, but does not fix the duration of the pulse. In practice the pulses decay very rapidly as the index tends to $-\infty$, and can be truncated to have essentially the same duration as an SLR pulse with similar design parameters.

In the Reflection Coefficient section above, it was noted that different pulses can produce the same resulting magnetization. As noted below, for a given profile, the energy of the pulse is minimized by choosing a to be non-vanishing in $\mathbb{D}$. This result, in the context of SLR, has been described by Pauly et al. in "Parameter Relations for the Shinnar-Le Roux Selective Excitation Pulse Design Algorithm," IEEE Trans. on Med. Imaging, Vol. 10 (1991), pp. 53–65. When designing a pulse with $\rho$ rephasing steps, a minimum energy pulse is obtained by choosing $rw^{\rho-1}$ to be analytic in $\mathbb{D}$, for then a has no zeros in the unit disk.

Equiripple pulse design. The SLR and 1ST approaches now will be compared for designing a minimum energy, selective, 90 degree pulse with a fixed rephasing time $\rho$ in terms of the design parameters, in-slice error, out-of-slice error, and transition width. The ideal magnetization profile is:

$$M_i(z) = \begin{bmatrix} M_x(z) \\ M_y(z) \\ M_z(z) \end{bmatrix} = \begin{cases} \begin{bmatrix} 0 \\ 1 \\ 0 \end{bmatrix} & |z| < 1 \\ \begin{bmatrix} 0 \\ 0 \\ 1 \end{bmatrix} & |z| > 1 + \tau, \end{cases}$$

where $\tau > 0$ is a fixed transition width. The accuracy of the two approaches may be compared using the following parameters:

$\delta_1$ = in-slice error in $M_z$ $\delta_2$ = out-of-slice error in $|M_x + iM_y|$.

For each of the two methods described below, the out-of-slice error $\delta_2$ is a function of the in-slice error $\delta_1$, since $\tau$ is fixed.

In the SLR method, one directly approximates only on the z-component of the ideal magnetization profile:

$$M_z(z) = \begin{cases} 0 & |z| < 1 \\ 1 & |z| > 1 + \tau, \end{cases}$$

obtaining b as a linear phase function of the form:

$$b = \sum_{j=1-\rho}^{\rho-1} b_j w^j$$

In slice, $$|b| \approx \frac{\sqrt{2}}{2},$$

while out of slice, $b \approx 0$. In practice one can find b using the Remez algorithm. If $|M_x + iM_y| < \delta_2$ out of slice, then, out of slice, one needs:

$$|b(w)| < \sqrt{\frac{1 - \sqrt{1 - \delta_2^2}}{2}} = \delta_{2,b}.$$

Using the parameter relations from Pauly et al., one can determine the in-slice ripple $\delta_{1,b}$ in b. It is $$1 - 2\left(\frac{\sqrt{2}}{2} + \delta_{1,b}\right)^2 < M_z < 1 - 2\left(\frac{\sqrt{2}}{2} - \delta_{1,b}\right)^2,$$

which gives the corresponding in-slice error $\delta_1$.

The second method, the 1ST method, involves designing r as a real-function of the form $$r = \sum_{j=1-\rho}^{\rho-1} r_j w^j$$

so that $r \approx 1$ in slice, and $r \approx 0$ out of slice. Again, the Remez algorithm is used. If one wants $|M_x + iM_y| < \delta_2$ out of slice, then, out of slice:

$$|r| < \frac{1 - \sqrt{1 - \delta_2^2}}{\delta_2} = \delta_{2,r}.$$

Again, using the parameter relations from Pauly et al., one can determine the in-slice ripple $\delta_{1,r}$ in r as:

$$\frac{1 - (1 + \delta_{1,r}^2)}{1 + (1 + \delta_{1,r}^2)} < M_z < \frac{1 - (1 - \delta_{1,r}^2)}{1 + (1 - \delta_{1,r}^2)},$$

which gives the corresponding in-slice error $\delta_1$.

By carrying out these calculations for different values of $\rho$ and $\tau$, it will be appreciated that the IST method seems to give better results (i.e. smaller values of $\delta_1$ as a function of $\delta_2$). FIG. 2 shows a comparison of in-slice versus out-of-slice errors for two methods of pulse design for two different choices of transition width and rephasing time. Of course, the first pulses technically have infinite duration though, as noted above, they can be truncated to have essentially the same length as the comparable SLR pulse.

Algorithms for Generating Pulses

In this section, an algorithm for obtaining a pulse which yields a given magnetization profile in accordance with the invention is derived. For purposes of comparison, the SLR recursion is derived first. The method of the invention, referred to herein as the discrete inverse scattering algorithm (DIST) is then provided. The DIST is a particular discrete approximation of the full inverse scattering transform. As with the standard derivation of the SLR algorithm, these computations become far more transparent if the work is performed in the spin domain. The needed transformation formulae are given in the following section.

The spin domain. $\mathbb{R}^3$ is associated with the Lie algebra $su_2$ via the relationship:

$$\begin{bmatrix} M_x \\ M_y \\ M_z \end{bmatrix} \leftrightarrow -\frac{i}{2} \begin{bmatrix} M_z & M_y - iM_x \\ M_y + iM_x & -M_z \end{bmatrix}.$$

Then the precession operator $P_\Delta$ corresponds to conjugation by the matrix:

$$\begin{bmatrix} w^{-1/2} & 0 \\ 0 & w^{1/2} \end{bmatrix} \in SU_2, \text{ where } w = e^{iz\Delta},$$

and the rotation $R_\omega$ corresponds to conjugation by the matrix:

$$\begin{bmatrix} \alpha & -\beta^* \\ \beta & \alpha \end{bmatrix} \in SU_2. \tag{79}$$

Then:

$$\beta = \frac{\omega^*}{|\omega|}\sqrt{\frac{1 - \cos|\omega|}{2}} \tag{80}$$

$$\alpha = \sqrt{1 - |\beta|^2} = \sqrt{\frac{1 + \cos|\omega|}{2}}.$$

More explicitly, the action of the operator $P_\Delta R_\omega$ is given by:

$$P_\Delta R_\omega: -\frac{i}{2}\begin{bmatrix} M_z & M_y - M_x i \\ M_y + M_x i & -M_z \end{bmatrix} \mapsto -\frac{i}{2}\psi_\omega \begin{bmatrix} M_z & M_y - M_x i \\ M_y + M_x i & -M_z \end{bmatrix}\psi_\omega^*$$

where:

$$\psi_\omega = \begin{bmatrix} w^{-1/2} & 0 \\ 0 & w^{1/2} \end{bmatrix}\begin{bmatrix} \alpha & -\beta^* \\ \beta & \alpha \end{bmatrix} \in SU_2.$$

Scattering theory (part 2). $\Omega: \mathbb{Z} \to \mathbb{C}$ is a hard pulse, and $T_{-,j}$ and $T_{+,j}$ are as defined above so that the scattering operator is:

$$S_\Omega = T_{+,j}^{-1} T_{-,j}$$

for all $j \in \mathbb{Z}$. Let us define $$U_{\pm,j} := T_{\pm,j} P_{-j\Delta}.$$

The recursion in Equation (63) in terms of these operators is:

$$U_{\pm,j+1} = P_\Delta R_{\omega j} U_{\pm,j} P_{-\Delta}. \tag{81}$$

and the normalization is $$\lim_{j \to \pm\infty} U_{\pm,j} = Id.$$

The scattering operator is given by $$S_\Omega = P_{-j\Delta} U_{+,j}^{-1} U_{-,j} P_{j\Delta} \tag{82}$$

for all $j \in \mathbb{Z}$.

All of these operators are now reexpressed in terms of matrices in $SU_2$ as in the previous section. The scattering operator is given in terms of (a, b) by:

$$S_\Omega = \begin{bmatrix} a & -b^* \\ b & a^* \end{bmatrix} \in SU_2.$$

The operator $S_\Omega$ acts on $su_2$ valued functions of w by conjugation by this matrix. This complex 2×2 matrix corresponds to the real 3×3 matrix in Theorems 4 and 5. By analogy with the continuum case, the functions a and b are called the scattering coefficients. Similarly:

$$U_{\pm,j} = \begin{bmatrix} A_{\pm,j} & -B_{\pm,j}^* \\ B_{\pm,j} & A_{\pm,j}^* \end{bmatrix} \in SU_2.$$

It can be shown that, for an admissible pulse, the functions $\{A_{-,j}, B_{-,j}, A_{+,j}^*, B_{+,j}^*\}$ extend analytically to the unit disk.

This is the discrete analogue of the analytic extension properties of the normalized eigenfunctions $\{\psi_{1,-}, \psi_{2,+}\}$ in the continuum case.

The recursion of Equation (81) is:

$$\begin{bmatrix} A_{\pm,j+1} & -B_{\pm,j+1}^* \\ B_{\pm,j+1} & A_{\pm,j+1}^* \end{bmatrix} = \begin{bmatrix} w^{-1/2} & 0 \\ 0 & w^{1/2} \end{bmatrix}\begin{bmatrix} \alpha_j & -\beta_j^* \\ \beta_j & \alpha_j \end{bmatrix} \tag{83}$$

$$\begin{bmatrix} A_{\pm,j} & -B_{\pm,j}^* \\ B_{\pm,j} & A_{\pm,j}^* \end{bmatrix}\begin{bmatrix} w^{1/2} & 0 \\ 0 & w^{-1/2} \end{bmatrix},$$

where $(\beta_j, \alpha_j)$ are related to $\omega_j$ by Equation (80). In terms of the matrix components this can be written as:

$$\begin{bmatrix} A_{\pm,j+1} \\ B_{\pm,j+1} \end{bmatrix} = \alpha_j \begin{bmatrix} 1 & -\gamma_j^* \\ \gamma_j w & w \end{bmatrix}\begin{bmatrix} A_{\pm,j} \\ B_{\pm,j} \end{bmatrix}, \tag{84}$$

where $$\gamma_j = \frac{B_j}{\alpha_j}$$

$$\alpha_j = \sqrt{\frac{1}{1 + |\gamma_j|^2}}.$$

Notice that $\omega$ can be recovered from $\gamma$ by using the formula:

$$\omega = \frac{\gamma^*}{|\gamma|}\arcsin\frac{2|\gamma|}{1 + |\gamma|^2}. \tag{85}$$

Inverting Equation (84) gives:

$$\begin{bmatrix} A_{\pm,j} \\ B_{\pm,j} \end{bmatrix} = \alpha_j \begin{bmatrix} 1 & \gamma_j^* w^{-1} \\ -\gamma_j & w^{-1} \end{bmatrix}\begin{bmatrix} A_{\pm,j+1} \\ B_{\pm,j+1} \end{bmatrix}. \tag{86}$$

The scattering Equation (82) can be rewritten as:

$$\begin{bmatrix} a & -b^* w^{-j} \\ b w^j & a^* \end{bmatrix} = \begin{bmatrix} A_{+,j}^* & B_{+,j}^* \\ -B_{+,j} & A_{+,j} \end{bmatrix}\begin{bmatrix} A_{-,j} & -B_{-,j}^* \\ B_{-,j} & A_{-,j}^* \end{bmatrix}. \tag{87}$$

The energy formula. Let $\Omega$ be a valid hard pulse, and let $$a = \sum_{j=0}^{\infty} a_j w^j$$

$$b = \sum_{j=-\infty}^{\infty} b_j w^j$$

be the corresponding scattering coefficients. It is assumed that a has finitely many zeros in $\mathbb{D}$, $\{\zeta_j\}$ with multiplicities $\{d_j\}$. Then a may be written as:

$$a = \prod_{k=1}^{m}\left(\frac{|\zeta_k|}{\zeta_k}\cdot\frac{\zeta_k-w}{1-\zeta_k^* w}\right)^{d_k}\tilde{a}, \qquad (88)$$

where $\tilde{a}$ is non-vanishing in $\mathbb{D}$.

By Equation (84):

$$a_0 = \prod_{j=-\infty}^{\infty}\alpha_j \text{ or} \qquad (89)$$

$$\log a_0 = \sum_{j=-\infty}^{\infty}\log\alpha_j = -\frac{1}{2}\sum_{j=-\infty}^{\infty}\log(1+|\gamma_j|^2).$$

On the other hand, using Equation (88):

$$\log a_0 = \sum_{k=1}^{m}\log|\zeta_k| + \log\tilde{a}(0).$$

Since $\log|\tilde{a}|$ is harmonic in the disk:

$$\log a_0 = \sum_{k=1}^{m}\log|\zeta_k| + \frac{1}{2\pi}\int_0^{2\pi}\log|\tilde{a}(e^{i\theta})|d\theta. \qquad (90)$$

$$= \sum_{k=1}^{m}\log|\zeta_k| + \frac{1}{2\pi}\int_0^{2\pi}\log|a(e^{i\theta})|d\theta \qquad (91)$$

Equations (89), and (91) together give:

$$\frac{1}{2}\sum_{j=-\infty}^{\infty}\log(1+|\gamma_j|^2) = -\frac{1}{2\pi}\int_0^{2\pi}\log|a(e^{i\theta})|d\theta - \sum_{k=1}^{m}\log|\zeta_k|$$

$$\sum_{j=-\infty}^{\infty}\log(1+|\gamma_j|^2) = \frac{1}{2\pi}\int_0^{2\pi}\log(1+|r(e^{i\theta})|^2)d\theta - 2\sum_{k=1}^{m}\log|\zeta_k|,$$

where $$r = \frac{b}{a}$$

is the reflection coefficient. This formula is the discrete analogue of the formula for the energy of a pulse in terms of the reflection coefficient and bound states. In the absence of bound states, a related, though somewhat less explicit formula appears in the aforementioned Pauly et al. article.

If the hard pulse is an approximation to a smooth pulse $q(t)$, then:

$$\omega_j \approx 2\Delta q(j\Delta)$$

If $\Delta$ is small, then $\gamma_j$ is also small and therefore:

$$\log(1+|\gamma_j|^2) \approx |\gamma_j|^2 \approx \left|\frac{\omega_j}{2}\right|^2,$$

so the energy of the pulse is approximated by:

$$\int|q(t)|^2 dt \approx \frac{1}{\Delta}\sum_{j=-\infty}^{\infty}\left|\frac{\omega_j}{2}\right|^2 \qquad (92)$$

$$\approx \frac{1}{2\pi\Delta}\int_0^{2\pi}\log(1+|r(e^{i\theta})|^2)d\theta - \frac{2}{\Delta}\sum_{k=1}^{m}\log|\zeta_k|.$$

The factors of $\Delta^{-1}$ on the right hand side account for the scaling between the range of physical offset frequencies, and the interval $[0, 2\pi]$. Recall that $|\zeta_k|<1$, so the inclusion of bound states increases the energy.

The Shinnar-Le Roux recursion. Consider a hard pulse $\Omega$, of finite duration, so that $\omega_j=\Omega(j)$ vanishes for j outside the interval $[\rho-N, \rho]$. The recursive part of the Shinnar-Le Roux (SLR) algorithm is a procedure for recovering $\Omega$ from the scattering data $S_\Omega$. For purposes of comparison, the SLR algorithm is derived using the above notation.

Since $$\begin{bmatrix}A_{-,\rho-N}\\B_{-,\rho-N}\end{bmatrix} = \begin{bmatrix}1\\0\end{bmatrix} = \begin{bmatrix}A_{+,\rho}\\B_{+,\rho}\end{bmatrix}. \qquad (93)$$

it can be seen from the scattering Equation (87) that:

$a = A_{-,\rho}$ $bw^\rho = B_{-,\rho}$.

It follows from Equations (84) and (93) that $A_{-j}$ and $B_{-j}$ are polynomials in w for all $j > \rho-N$. In fact, these polynomials must be of the form:

$$A_{-,j} = \sum_{k=0}^{j+N-\rho-1}\hat{A}_{-,j(k)}w^k$$

$$B_{-,j} = \sum_{k=1}^{j+N-\rho}\hat{B}_{-,j(k)}w^k,$$

with $\hat{A}_{-j}(0)>0$. This implies that a and b are of the form:

$$a = \sum_{k=0}^{N-1}a_k w^k$$

$$b = \sum_{k=1-\rho}^{N-\rho}b_k w^k,$$

with $a_0>0$. This proves the first part of Theorem 4.

Using the recursion of Equation (86) together with the fact that the constant coefficient of $B_{-j}$ always vanishes:

$-\alpha_j\gamma_j\hat{A}_{-j}(0)+\alpha_j\hat{B}_{-j}(1)=0$.

which implies that:

$$\gamma_j = \frac{\hat{B}_{-,j}(1)}{\hat{A}_{-,j}(0)}.$$

One can therefore determine $A_{-j}$ and $B_{-j}$ from $A_{-j+1}$ and $B_{-j+1}$ using Equation (86) along with this expression for $\gamma_j$. Thus, one can recursively reconstruct $\{\gamma_j\}$ starting from $A_{-p}=a$ and $B_{-p}=bw^0$. The pulse $\{\omega_j\}$ is then obtained using Equation (85).

To prove Theorem 4, one still needs to show that the algorithm works if one starts with arbitrary functions a and b (of the correct form). The details can be found in the paper by Shinnar et al. entitled "Inversion of the Bloch Equation," J. Chem. Phys., Vol. 98 (1993), pp. 6121–6128.

The discrete inverse scattering approach. In the discrete inverse scattering approach of the invention, the input data is a reflection coefficient r, which is defined on the unit circle, along with data specifying the bound states. Half of this data is a set of points $\{\zeta_1, \ldots, \zeta_m\}$ in the unit disk. For simplicity, one may suppose that these points are distinct, though higher multiplicity poses no obstacle in principle, as noted below. With this simplifying assumption, the other half of the data is a set of m nonvanishing complex numbers $\{c_1, \ldots, c_m\}$. In the continuum case these are called norming constants.

An alternative method for reconstructing $\Omega$ from $S_\Omega$ will now be described that does not require $\Omega$ to have finite duration. Given the reflection coefficient, as a Fourier series, this method is also recursive, though the actual recursion is quite different from that used in SLR. The derivation of the algorithm makes extensive usage of the projection operators, $\Pi_\pm$ defined above.

It is assumed that $A_{-j}$, $w^{-1}B_{-j}$, $A^*_{+j}$, and $B^*_{+j}$ are all analytic in the unit disk, since this is the case for admissible pulses. By the scattering Equation (87):

$$\begin{bmatrix} A_{-,j} & -B^*_{-,j} \\ B_{-,j} & A^*_{-,j} \end{bmatrix} = \begin{bmatrix} A_{+,j} & -B^*_{+,j} \\ B_{+,j} & A^*_{+,j} \end{bmatrix} \begin{bmatrix} a & -b^*w^{-j} \\ bw^j & a^* \end{bmatrix},$$

or $$A_{-j}=aA_{+j}-b\omega^j B^*_{+j} \qquad (94)$$

$$B_{-j}=aB_{+j}+b\omega^j A^*_{+j}. \qquad (95)$$

Dividing by a, rearranging, and applying $\Pi_-$ one gets:

$$A_{+,j} = \hat{A}_{+,j}(0) + \Pi_- r w^{j-1}(w^{-1}B_{+,j})^* + \Pi_- \frac{1}{a}A_{-,j} \qquad (96)$$

$$w^{-1}B_{+,j} = -\Pi_- r w^{j-1}A^*_{+,j} + \Pi_- \frac{1}{a}w^{-1}B_{-,j}, \qquad (97)$$

where $$r = \frac{b}{a}.$$

The foregoing calculation is correct whether or not a vanishes in the unit disk. One may now derive the algorithm assuming that there are no bound states, and then give the necessary modifications to include this data.

The DIST recursion with no bound states. One restricts to the case where a has no zeros in $\mathbb{D}$. By analogy with the continuum theory, there are no bound states. The terms $$\Pi_- \frac{1}{a}A_{-,j}$$

and $$\Pi_- \frac{1}{a}w^{-1}B_{-,j}$$

vanish, and so:

$$A_{+,j}=\hat{A}_{+,j}(0)+\Pi_- rw^{j-1}(w^{-1}B_{+,j})^*$$

$$w^{-1}B_{+,j}=-\Pi_- rw^{j-1}A^*_{+,j}.$$

These equations are the discrete analogue of the matrix Marchenko equation for the spin domain Bloch equation. They can be combined into the single equation:

$$(1 + \Pi_+ r^*w^{-j+1}\Pi_- rw^{j-1})\frac{wB^*_{+,j}}{\hat{A}_{+,j}(0)} = -\Pi_+ r^*w^{-j+1}. \qquad (98)$$

By examining the coefficient of w in Equation (84):

$$-\gamma^*_j = \frac{\hat{B}^*_{+,j}(0)}{\hat{A}_{+,j}(0)}. \qquad (99)$$

Thus $\gamma_j$ could be obtained from the first coefficient of the solution to the Marchenko Equation (98). Just as in the SLR algorithm, the pulse could then be computed using Equation (85). One could therefore generate the pulse by solving Equation (98) directly for each j. As shown below, there is a recursive algorithm for determining $\gamma_j$. This algorithm is much more efficient, and stable than solving the Marchenko equation directly.

The DIST recursion with bound states. For the case where a has zeros in $\mathbb{D}$, it may be assumed that there are finitely many bound states, with a vanishing on the set $\zeta=\{\zeta_1, \ldots, \zeta_m\} \subset \mathbb{D}$. The terms $$\Pi_- \frac{1}{a}A_{-,j}$$

and $$\Pi_- \frac{1}{a}w^{-1}B_{-,j}$$

appearing in Equations (96) and (97) need to be treated. For that purpose, it is assumed that there is a sequence of functions $\{Q_{+,j}(w): j \in \mathbb{Z}\}$ with following properties:

a. For each $j \in \mathbb{Z}$, $a(w)Q_{+,j}(w)$ is analytic and non-vanishing in the unit disk.

b. For each $j \in \mathbb{Z}$ the following relations hold:

$$\Pi_{-}\frac{1}{a}A_{-,j} = -\Pi_{-}Q_{+,j}(w^{-1}B_{+,j})^{*} \tag{100}$$

$$\Pi_{-}\frac{1}{a}w^{-1}B_{-,j} = \Pi_{-}Q_{+,j}A^{*}_{+,j}. \tag{101}$$

c. For each $j \in \mathbb{Z}$, and $k>0$ the difference $Q_{+,j+k} - w^k Q_{+,j}$ is analytic in the unit disk.

It will be explained below how these functions are constructed from the data specifying the bound states. Since a does not vanish at $w=0$, the first and third conditions show that knowledge of one of the functions $Q_{+,j0}$ suffices to determine all the others. In practice, one such function is taken as the data which specifies the bound states. In the context of the present discussion, the reflection coefficient $r(w)$ on the unit disk and the bound states are entirely independent of one another. In many applications, the reflection coefficient extends as a meromorphic function to the unit disk, and the data specifying the bound states is taken from the singular parts of r at these poles.

Suppose that $\Omega$ is an admissible pulse, so that $A^{*}_{+,j}$ and $B^{*}_{+,j}$ are analytic in $\mathbb{D}$ for all j. With these functions, Equations (96) and (97) can be rewritten as:

$$A_{+,j} = \hat{A}_{+,j}(0) + \Pi_{-}(rw^{j-1} - Q_{+,j})(w^{-1}B_{+,j})^{*} \tag{102}$$

$$w^{-1}B_{+,j} = -\Pi_{-}(rw^{j-1} - Q_{+,j})A^{*}_{+,j}. \tag{103}$$

These equations can again be combined into the single Marchenko equation:

$$(1 + \Pi_{+}r^{*}_{j}\Pi_{-}r_{j})\frac{wB^{*}_{+,j}}{\hat{A}_{+,j}(0)} = -\Pi_{+}r^{*}_{j}, \tag{104}$$

where:

$$r_j = \frac{b}{a}w^{j-1} - Q_{+,j}.$$

Once again, it is possible to compute $\{w_j\}$ by first solving Equation (104), and then using Equations (99) and (78). In practice however, the recursion derived in the next section is used. The case derived in the previous section, where a has no zeros in $\mathbb{D}$, can now be thought of as the special case where $Q^{+,j}=0$ for all j.

A recursive algorithm for 1ST. A recursive algorithm is now given for the determination of $\{\gamma_j\}$. Equation (84) states that $A_{+}$ and $B_{+}$ satisfy the recursion:

$$\begin{bmatrix} A_{+,j} \\ B_{+,j} \end{bmatrix} = a_j \begin{bmatrix} 1 & \gamma^{*}_{j}w^{-1} \\ -\gamma_j & w^{-1} \end{bmatrix} \begin{bmatrix} A_{+,j+1} \\ B_{+,j+1} \end{bmatrix}.$$

Plugging this formula into Equations (102) and (103) and using the fact that $\Pi_{-}r_j w = \Pi_{-}r_{j+1}$, one gets:

$$A_{+,j+1} + \gamma^{*}_{j}w^{-1}B_{+,j+1} = \hat{A}_{+,j+1}(0) - \gamma^{*}_{j}\Pi_{-}r_{j+1}A^{*}_{+,j+1} + \tag{105}$$

$$\Pi_{-}r_{j+1}(w^{-1}B_{+,j+1})^{*} - \gamma_j A_{+,j+1} + w^{-1}B_{+,j+1} = -w\Pi_{-}r_j A^{*}_{+,j+1} - \gamma_j w \Pi_{-}r_j (w^{-1}B_{+,j+1})^{*}.$$

Examining the constant coefficient of the second equation:

$$-\gamma_j \hat{A}_{+,j+1}(0) = -\mathcal{F}(r_j A^{*}_{+,j+1})(-1) - \gamma_j \mathcal{F}(r_j w B^{*}_{+,j+1})(-1)$$

$$= -\mathcal{F}(r_{j+1}A^{*}_{+,j+1})(0) - \gamma_j \mathcal{F}(r_{j+1}wB^{*}_{+,j+1})(0).$$

As noted above, $\mathcal{F}(h)(n)$ denotes the coefficient of $w^n$ in the Fourier series of h. Solving for $\gamma_j$ gives:

$$\gamma_j = \frac{\mathcal{F}(r_{j+1}A^{*}_{+,j+1})(0)}{\hat{A}_{+,j+1}(0) - \mathcal{F}(r_{j+1}(w^{-1}B_{+,j+1})^{*})(0)}. \tag{106}$$

Thus, one can reconstruct $A_{+,j}$ and $B_{+,j}$ from $A_{+,j+1}$ and $B_{+,j+1}$ using this expression for $\gamma_j$ along with the recursion of Equation (86). To begin the recursion, it is assumed that at a sufficiently positive value of j, $A_{+,j}$ is very close to 1, and $B_{+,j}$ is very close to 0. The pulse is then obtained using Equation (85).

Equation (104) is the discrete analogue of the right Marchenko equation. As in the continuum case, there is also a left Marchenko equation. When there are nontrivial bound states, it is important to use both equations in order to control the instability that arises from these ill conditioned linear systems. In the next section, the analogue of the left Marchenko equation is provided, which gives a recursion for determining $\{\gamma_j\}$ in terms of $A_{-,j}$ and $B_{-,j}$.

The left Marchenko equation. The same analysis is carried out beginning with the equations:

$$A^{*}_{+,j} = aA^{*}_{-,j} + b^{*}w^{-j}B_{-,j} \tag{107}$$

$$B^{*}_{+,j} = aB^{*}_{-,j} - b^{*}w^{-j}A_{-,j}. \tag{108}$$

instead of Equations (94) and (95). The left Marchenko equation is then:

$$(1 + \Pi_{+}s^{*}_{j}\Pi_{-}s_{j})\frac{B_{-,j}}{\hat{A}_{-,j}(0)} = -\Pi_{+}s^{*}_{j} \tag{109}$$

where:

$$s_j = sw^{-j} - Q_{-,j+1}$$

$$s = \frac{-b^{*}}{a}$$

and $Q_{-,j}$ is meromorphic in the disk, with the same poles and multiplicities as $$\frac{1}{a}.$$

The function $Q_{-j}$ is related to $Q_{+j}$ by:

$$\Pi_{-a} Q_{-,j} Q_{+,j} = \Pi_{-} \frac{1}{a}. \tag{110}$$

Using the technique from the preceding section, one obtains:

$$-\gamma_{j-1}^* = \frac{\mathcal{F}(s_{j-1} A_{-,j-1})(0)}{\hat{A}_{-,j-1}(0) - \mathcal{F}(s_{j-1} B_{-,j-1})(0)}. \tag{111}$$

One can reconstruct $\{\gamma_j\}$ from s and $Q_-$ using Equation (111) with the recursion of Equation (84). The recursion starts at a sufficiently negative value of j where $A_{-j}$ and $B_{-j}$ are approximated to be 1 and 0, respectively.

Practical Pulse Synthesis

In the previous section, recursions were derived for determining the coefficients $\{\gamma_j\}$, which, in turn, gives the desired hard pulse. What remains is to describe how to go from an ideal magnetization profile $M_t(z)$, on the real axis, and data specifying bound states, to the recursion described above. The data is now described for the right Marchenko equation. The calculation of the data for the left equation is described in the next section.

The first step is to compute the reflection coefficient $r_i(z)$ determined by $M_i(z)$. As described above, $r_i(z)$ is approximated, on a fixed finite interval, by a finite Fourier series in $w = e^{iz\Delta}$, $$r(w) = \sum_{j=1-\rho}^{M} \hat{r}(n) w^n. \tag{112}$$

Note that, under the map $z \to e^{iz\Delta}$, the upper half plane maps to the unit disk. The time spacing, $\Delta$, must be chosen so that the range of frequencies of interest lies in an interval of the form $I=[z_0-\Delta^{-1}\pi, z_0+\Delta^{-1}\pi]$. The ideal reflection coefficient is assumed to vanish outside this interval. For minimum energy pulse synthesis, r(w) is usually found using a Remez type algorithm. For other applications, such as self refocused pulses, different sorts of approximations may be more appropriate as explained below.

The next step is to consider how to specify the bound states. Let $\{z_1, \ldots, z_m\}$ (where $z_k = 2\zeta_k$) be distinct points in the upper half plane. As in the continuum case, the specification of the bound state data is, in principle, entirely independent of the behavior of r on the unit circle. If the multiplicities $\{d_j\}$ are all equal to one, then, by analogy with the continuum case, the bound states are specified by a rational function of the form:

$$Q_{+,0}(w) = \sum_{k=1}^{m} \frac{c_k}{w - \zeta_k}. \tag{113}$$

The location of the pole $\zeta_k$ is related to $z_k$ by $\zeta_k = e^{iz_k\Delta}$. The coefficients $\{c_k\}$ are the data corresponding to the norming constants $\{C_k\}$. For small $\Delta$, $c_k \approx C_k \Delta$. The locations of the poles place a further constraint on $\Delta$: the points $\{z_1, \ldots, z_m\}$ must lie in the strip $I+i\mathbb{R}$, where $I=[C_{z_a z^z_1}]$. If the multiplicities are not all one, the data specifying the bound states is described by choosing the rational function, $Q_{+,0}$, to be of the form:

$$Q_{+,0}(w) = \sum_{k=1}^{m} \frac{P_{+,k}(w)}{(w - \zeta_k)^{d_k}},$$

for $\zeta_k \in \mathbb{D}$, $d_k$ a positive integer, and $P_{+,k}$ a polynomial of degree at most $d_k - 1$, which does not vanish at $\zeta_k$. The analogous data for the left equation is described in the next section.

Once $Q_{+,0}$ is specified, then the other functions $Q_{+j}$ are determined by the relations $$Q_{+,j} = w^j Q_{+,0} \text{ for } j>0$$

$$Q_{+,j} w^j Q_{+,0} - \Pi_{(0)}(w^j Q_{+,0}) \text{ for } j<0. \tag{114}$$

These functions satisfy the relations in Equations (100) and (101). Examples are given below that demonstrate that the inclusion of bound states dramatically alters the pulse without changing the reflection coefficient. In other words, the bound state data, as described herein, are indeed the free auxiliary parameters in the pulse synthesis problem.

The Marchenko kernel. Using the fact that $\Pi_+ f^* = [\Pi_- f]^*$, it may be deduced that the left and right Marchenko equations only require a knowledge of $\Pi_- r_j$, and $\Pi_+ s_j$, respectively. It may be assumed that $r_j$ and $s_j$ are bounded functions for all j. Since $\Pi_- r_j w^k = \Pi_- r_{j+k}$, whenever $k \geq 0$:

$$f(n) := \mathcal{F}(r_j)(n+j) \text{ for } n+j<0.$$

This the discrete right Marchenko kernel. Similarly, the discrete left Marchenko kernel is defined by:

$$g(n) := \mathcal{F}(s_j)(n-j) \text{ for } n-j<0.$$

Recall that $r_j = rw^{j-1} - Q_{+j}$. By computing Fourier series, the right Marchenko kernel is given by:

$$f(n) = \hat{r}(n+1) - \sum_{k=1}^{m} \tilde{P}_{+,k}(n) \zeta_k^{-n-1},$$

where $\tilde{P}_{+,k}$ is a polynomial of degree $d_k - 1$. Note that the finite sum is exponentially decreasing as n tends to $-\infty$ and exponentially increasing as n tends to $+\infty$. It is this exponential growth that necessitates the introduction of the left Marchenko equation when there are nontrivial bound states. The formula for $\tilde{P}_{+,k}$ is omitted in terms of $P_{+,k}$ but in the case where $d_k = 1$ it is seen that $\tilde{P}_{+,k} = P_{+,k} = c_k$, a constant. The Marchenko kernel f(n) may be nonzero for all $n \in \mathbb{Z}$ though in general it decays exponentially as n tends to $-\infty$. In practice one truncates the kernel at a finite $N_{max}$ so that:

$$\sum_{n=N_{\max}+1}^{\infty}|f(-n)|$$

is sufficiently small. As is evident in the examples, this does not present any serious difficulties.

The data describing the bound states for the left Marchenko equations is derived from $Q_{+,0}$ and the scattering coefficient a. It is described by a function $Q_{-,0}$:

$$Q_{-,0}(w) = \sum_{k=1}^{m} \frac{P_{-,k}(w)}{(w-\zeta_k)^{d_k}}$$

that can be determined from $Q_{+,0}$ and a by using the fact that:

$$P_{-,k}P_{+,k} \equiv \frac{a^2}{(w-\zeta_k)^{2d_k}} \mod(w-\zeta_k)^{d_k}$$

(see Equation (110)). In the case where $d_k=1$, so $P_{\pm,k}$ are constants, this becomes:

$$P_{-,k} = \frac{1}{P_{+,k}a'(\zeta_k)^2}.$$

Once $Q_{-,0}$ is obtained, one can compute the left Marchenko kernel:

$$g(n) = \hat{s}(n) - \sum_{k=1}^{m} \bar{P}_{-,k}(n)\zeta_k^{-n-2}.$$

Again, the formula for the polynomial $\tilde{P}_{-,k}$, is omitted except when $d_k=1$, in which case:

$$\bar{P}_{-,k} = P_{-,k} = \frac{1}{\overline{P_{+,k}a'(\zeta_k)^2}} = \frac{1}{\bar{P}_{+,k}\bar{a}'(\bar{\zeta}_k)^2}.$$

Thus, the role of the bound states in the structure of the Marchenko kernels exactly parallels the situation in the continuum theory.

A situation will now be described where the data describing the bound states is derived from the reflection coefficient. Suppose that one is given an ideal reflection coefficient $r_i$ and would like a pulse that requires $\rho$ rephasing time steps. To find a minimum energy pulse, $r_i$ is approximated by a function r with a Fourier series of the form:

$$r(w) = \sum_{j=1-\rho}^{\infty} \hat{r}(n)w^n.$$

This is usually done using a Remez type algorithm. One specifies transition widths, and in-slice and out-of-slice ripples. These parameters, along with the rephasing time, are related. In general, once the rephasing time is fixed then, within certain bounds, two of the other three parameters can be specified. These parameter relations are described in detail by Pauly et al.

If one wishes to include bound states, then $r_i$ is instead approximated by a rational function r so that $rw^{\rho-1}$ is analytic and nonvanishing in a neighborhood of 0. Let $\zeta = \{\zeta_1, \ldots, \zeta_m\}$ be the poles in $\mathbb{D}$ with multiplicities $d_1, \ldots, d_m$. It is also assumed that r does not vanish at $1/\zeta_j^*$ for $j=1,\ldots,m$.

Define a and b as above so that $$r = \frac{b}{a}.$$

It may be shown that a and b are rational functions. In order for $\Omega$ to have $\rho$ rephasing time steps, one sets:

$$Q_{+,\rho} = \Pi_{-}\frac{bw^{\rho-1}}{a} = \Pi_{\zeta}\frac{bw^{\rho-1}}{a}.$$

One can then set:

$$Q_{-,\rho} = \Pi_{\zeta}\frac{b^*w^{1-\rho}}{a},$$

because:

$$\Pi_{-}aQ_{+,\rho}Q_{-,\rho} = \Pi_{-}a\Pi_{\zeta}\frac{b^*b}{a^2}$$
$$= \Pi_{\zeta}\frac{1-a^*a}{a}$$
$$= \Pi_{\zeta}\left(\frac{1}{a} - a^*\right)$$
$$= \Pi_{-}\frac{1}{a}.$$

The last step follows from the fact that $a^*$ is analytic at each $\zeta_k$ (since it was assumed that r does not vanish at $1/\zeta_k^*$). Therefore:

$$r_\rho = 0$$

$$s_{\rho-1} = \frac{b^*w^{1-\rho}}{a} - \Pi_{\zeta}\frac{b^*w^{1-\rho}}{a},$$

is used as initial data to determine the right and left Marchenko kernels.

As a particular case of this construction, r may be taken to be a rational function, analytic in a neighborhood of 0. In this case $\rho=1$, and the corresponding pulse requires no rephasing, i.e., is a self refocused pulse. This is an instance where r would not be defined by using a Remez type algorithm. Rather one would specify the locations of the poles, $\{\zeta_1, \ldots, \zeta_m\}$, and look for a rational function, having poles in that set, which gives an "optimal" approximation to $r_j$. In general one would constrain the poles so that:

$$-\sum_{j=1}^{m} \log|\zeta_j| \leq E,$$

so as to not introduce too much additional energy. This is described in detail below.

Thus, in the case of simple bound states, the right and left kernels are related by a simple formula. When the multiplicities are increased, the relationship between the right and left kernels becomes much more complicated. However, all the information needed to derive the formula is contained in the above discussion.

The explicit algorithms. Putting the pieces together, one can write down the explicit algorithms in terms of the left and right kernels. The reflection coefficient and bound state data determine the kernels:

$$f(n) = \hat{r}(n+1) - \sum_{k=1}^{m} \tilde{P}_{+,k}(n)\zeta_k^{-n-1}$$

and $$g(n) = \hat{s}(n) - \sum_{k=1}^{m} \tilde{P}_{-,k}(n)\zeta_k^{-n-2},$$

according to the above discussion.

One needs to select a starting point for each recursion. If $f(n)=0$ for $n<-n_0$ then $N_{max}=n_0-1$. Otherwise the coefficients $f(n)$ are checked and $N_{max}$ is chosen so that:

$$\sum_{n=N_{max}}^{\infty} |f(-n)|$$

is smaller than a fixed $\epsilon > 0$. Generally speaking $g(n)$ will not vanish for sufficiently negative $n$. The starting point for left recursion is therefore selected according to the latter criterion: $N_{min} < 0$ so that:

$$\sum_{n=-\infty}^{N_{min}-1} |g(n)| < \epsilon.$$

With these choices:

$K_{+,N_{max}} = [1\ 0\ 0\ 0\ \ldots]$ $L_{+,N_{max}} = [0\ 0\ 0\ 0\ \ldots]$ $K_{-,N_{min}} = [1\ 0\ 0\ 0\ \ldots]$ $L_{-,N_{min}} = [0\ 0\ 0\ 0\ \ldots].$ Then the following recursions are used:

$K_{+,j}(n) = \alpha_j [K_{+,j+1}(n) + \gamma_j L_{+,j+1}(n)]$ for $n \geq 0$ $L_{+,j}(n) = \alpha_j [-\gamma_j^* K_{+,j+1}(n-1) + L_{+,j+1}(n-1)]$ for $n \geq 1$ $L_{+,j}(0) = 0$ $K_{-,j}(n) = \alpha_j [K_{-,j-1}(n) - \gamma_{j-1}^* L_{+,j-1}(n)]$ for $n \geq 0$ $L_{-,j}(n) = \alpha_j [\gamma_{j-1} K_{-,j-1}(n-1) + L_{-,j-1}(n-1)]$ for $n \geq 1$ $L_{-,j}(0) = 0$ and the formulas $$\gamma_j = \frac{\sum_{n=0}^{\infty} f(-n-j-1)K_{+,j+1}(n)}{K_{+,j+1}(0) - \sum_{n=0}^{\infty} f(-n-j-1)L_{+,j+1}(n)} \quad (115)$$

$$-\gamma_{j-1}^* = \frac{\sum_{n=0}^{\infty} g(-n+j-1)K_{-,j-1}(n)}{K_{-,j-1}(0) - \sum_{n=0}^{\infty} g(-n+j-1)L_{-,j-1}(n)} \quad (116)$$

$\alpha_j = (1 + |\gamma_j|^2)^{-1/2}.$

The point at which to switch from the right to left recursion can be determined by evaluating the norms of the operators defined by the Marchenko kernels. A good rule of thumb is to switch at an index $j_0$ for which:

$$\sum_{n=j_0+1}^{\infty} |f(-n)| \approx \sum_{n=-\infty}^{j_0-1} |g(n)|.$$

Note that for $j \in \mathbb{Z}$, and $n \geq 0$:

$K_{+,j}(n) \approx \mathcal{F}(A^*_{+,j})(n)$ $L_{+,j}(n) \approx \mathcal{F}((w^{-1}B_{+,j+1})^*)(n)$ $K_{-,j}(n) \approx \mathcal{F}(A_{-,j})(n)$ $L_{-,j}(n) \approx \mathcal{F}(B_{-,j})(n).$

EXAMPLES

Minimum Energy Pulses: SLR vs. IST.

Figure 3B:
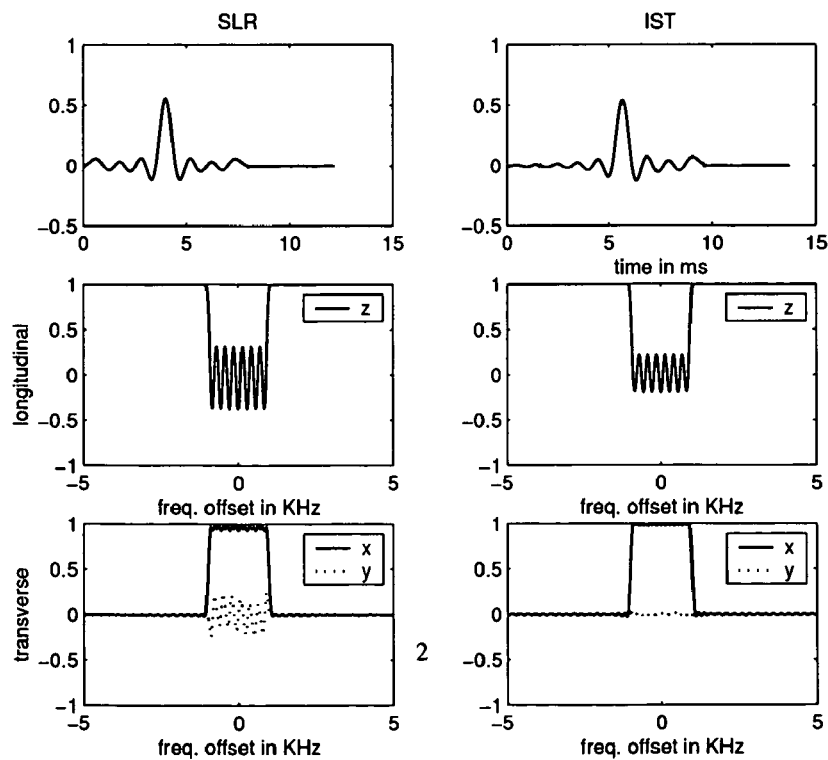
FIG. 3(b) illustrates SLR versus IST for a 90° pulse with 4 ms rephasing time, $\delta_2=0.01$ and the transition width is 0.15 KHz.

In these examples, both the SLR and IST approaches were used to design rather short 90° pulses with short transition regions. As a consequence, the in-slice ripple is fairly large. FIGS. 3(a) and 3(b) compare two such pulses, where the horizontal lines in the pulse plots, to the right of the pulse, indicate the rephasing times. FIG. 3(a) illustrates SLR versus IST for a 90° pulse with 2 ms rephasing time, $\delta_2 = 0.1$ and the transition width is 0.2 KHz. FIG. 3(b) illustrates SLR versus IST for a 90° pulse with 4 ms rephasing time, $\delta_2 = 0.01$ and the transition width is 0.15 KHz. They have the same rephasing times though the IST pulses are overall a little longer than the SLR pulses. In both cases, the IST pulse produces cleaner transverse and longitudinal profiles.

The effect of $T_2$ relaxation. In this section, the effect of a nonzero spin-spin relaxation time on the resulting magnetization profile is studied. In computer experiments, the precession operator $P_t$ is replaced by the operator $P_{t,T_2}$ given by:

$$P_t, T_2 M = \begin{bmatrix} e^{-t_2} & 0 & 0 \\ 0 & e^{-t_2} & 0 \\ 0 & 0 & 1 \end{bmatrix} \begin{bmatrix} \mathcal{R}e^{itz} & \mathcal{F}e^{itz} & 0 \\ -\mathcal{F}e^{itz} & \mathcal{R}e^{itz} & 0 \\ 0 & 0 & 1 \end{bmatrix} M.$$

Hence transverse relaxation effects are accounted for throughout the duration of the pulse. FIGS. 4(a) and 4(b) illustrate a comparison of the magnetization profiles produced by SLR and IST pulses with $T_2$=10 ms. As before, the horizontal lines in the pulse plots the rephasing times. FIG. 4(a) illustrates $T_2$=10 ms for a 90° pulse with 2 ms rephasing time, $\delta_2$=0.1 and the transition width is 0.2 KHz. FIG. 4(b) illustrates $T_2$=10 ms for a 90° pulse with 4 ms rephasing time, $\delta_2$=0.01 and the transition width is 0.15 KHz. FIGS. 4(a) and 4(b) show that even though the SLR pulses are overall slightly shorter, the effects of $T_2$-relaxation are a little less pronounced on the magnetization profiles produced by the IST method.

Refocusing pulse. Ideally, an inversion pulse maps the equilibrium magnetization [0,0,1] to the vector [0,0,-1] for offset frequencies lying in a specified band. For each offset frequency, $\xi$, such a pulse defines an orientation reversing rotation $R(\xi)$ of the transverse plane. The pulse is a refocusing pulse if and only if this rotation is independent of the offset frequency, within the band where the longitudinal magnetization is inverted. Using the scattering theory formula above, it is not difficult to show that an inversion pulse is refocusing if and only if $b(\xi)$ is real valued. This, in turn, implies that the pulse is symmetric. At the conclusion of such a pulse, the transformation of the transverse plane is a fixed reflection, e.g.

$$R_0 : \begin{bmatrix} 1 \\ 0 \\ 0 \end{bmatrix} \to \begin{bmatrix} -1 \\ 0 \\ 0 \end{bmatrix} \tag{117}$$

$$R_0 : \begin{bmatrix} 0 \\ 1 \\ 0 \end{bmatrix} \to \begin{bmatrix} 0 \\ 1 \\ 0 \end{bmatrix}.$$

Figure 5A:
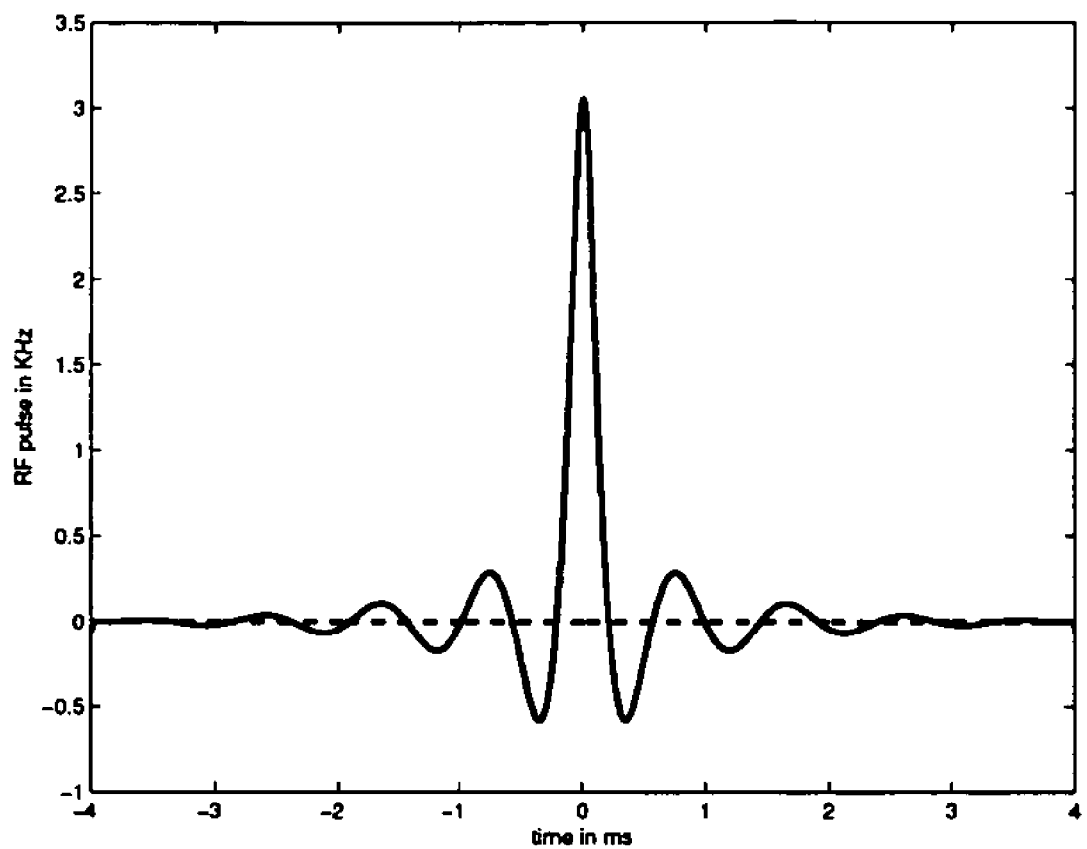
FIG. 5(a) illustrates a minimum energy, selective refocusing pulse designed to flip the equilibrium magnetization through 179° using the techniques of the invention.
Figure 5B:
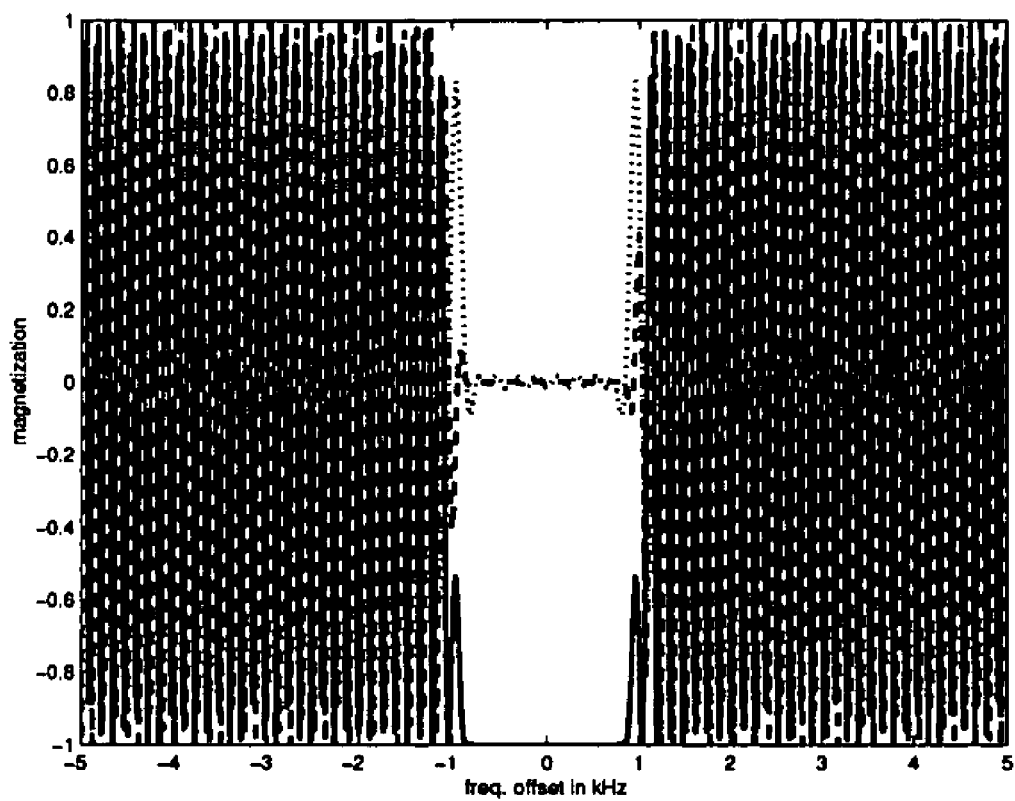
FIGS. 5(b)–5(d) illustrate the effect on the pulse in FIG. 5(a) on the initial vector [1,0,0], [0,1,0], and [0,0,1], respectively. The x-components are shown with a solid line, the y-components with a dashed line, and the z-components with a dotted line.
Figure 5C:
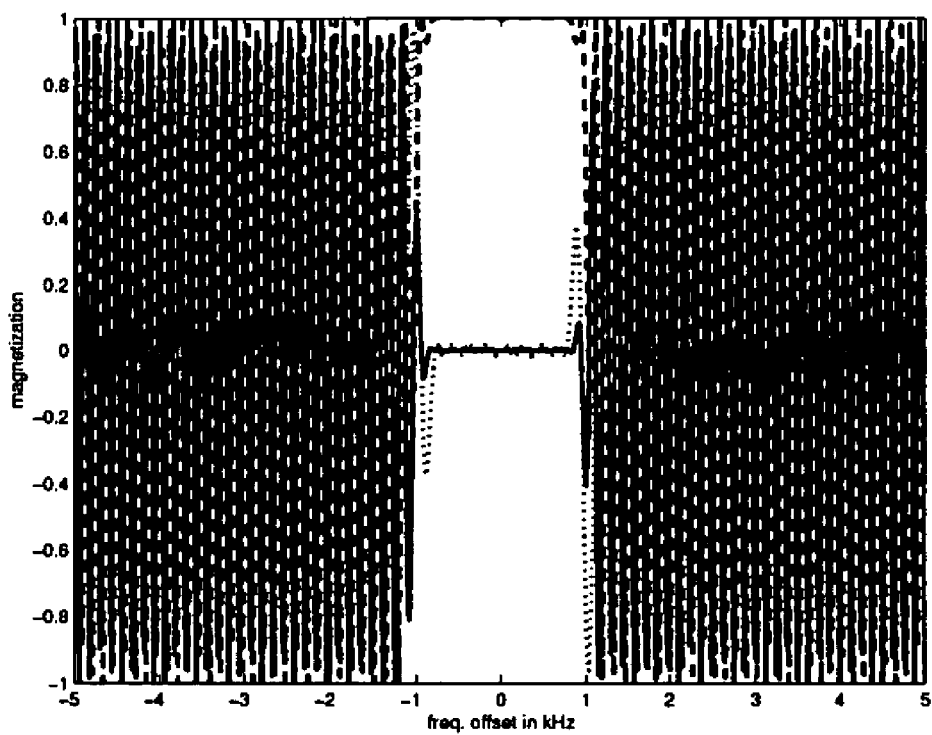
Figure 5D:
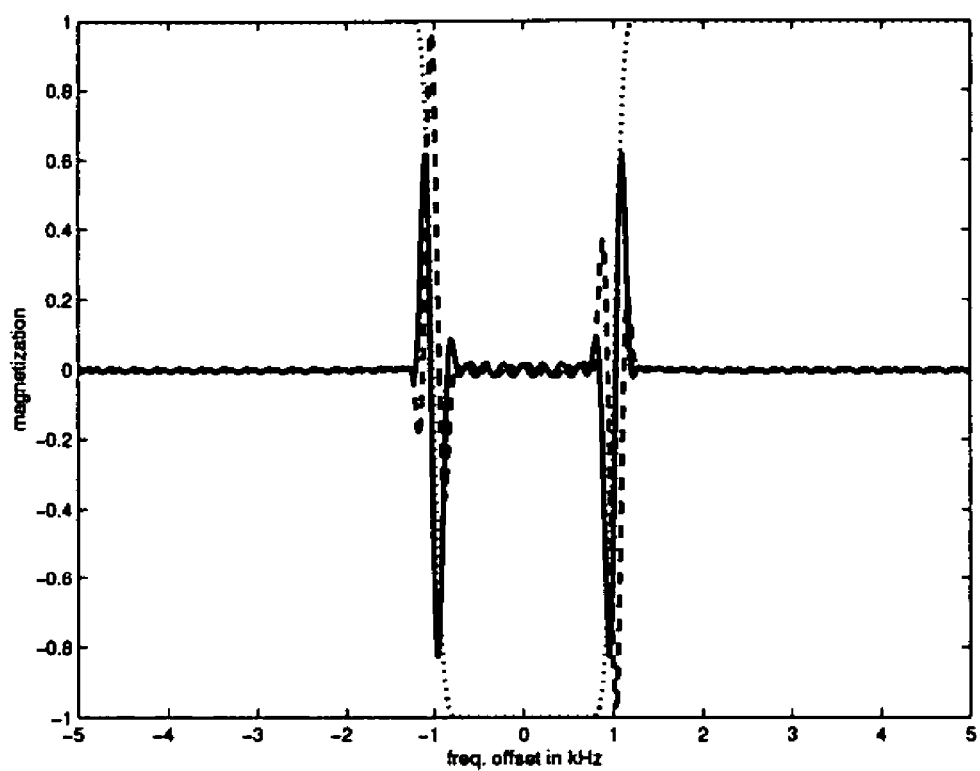

As noted above, it would require an infinite amount of energy to exactly invert the magnetization for offset frequencies belonging to a band of positive length. For this reason, a pulse is designed that takes [0,0,1] to [sin $\in$,0, -cos $\in$], for a small, positive $\in$. It is not difficult to show that, if $b(\xi)$ is real, then, in-slice, this produces a family of orientation preserving rotations of the transverse plane of the form $r_\in(\xi)R_0$, with $r_\in(\xi)-\text{Id}=o(\in^2)$. FIG. 5(a) shows a refocusing designed pulse to produce a 179°-flip of the equilibrium magnetization. FIGS. 5(b)–5(d) show the effects of this pulse on the x, y and z components of the magnetization. Note the saturation that occurs outside of the slice.

Self-refocused pulses. In many applications it is useful to design a self-refocused pulse, or a pulse with no rephasing time. It is important to understand the relationships between pulse energy, pulse duration, and the accuracy of the approximation. For example, the more poles r is allowed to have, the better the approximation can be. However, according to Equation (92), each added pole costs energy. But perhaps the most serious issue is the stability of the designed pulse. As noted above, pulses designed with bound states tend to be more sensitive to $B_1$-amplitude errors. In this section, techniques to practically design relatively low-energy, self-refocused pulses are described.

Let $r_i$ be the ideal reflection coefficient, as a function of the offset frequency z. For example, for a selective 90 degree pulse:

$$r_i(z) = \begin{cases} 1 & \text{if } |z| < 1 \\ 0 & \text{if } |z| > 1. \end{cases}$$

According to Theorem 4, one should approximate $r_i$ by a function r of $w=e^{iz\Delta}$ which is meromorphic in the unit disk, and analytic at the origin. Of course, r is a periodic function of z, so one actually approximates $r_i$ in a finite interval containing zero.

r is designed as a real valued rational function of w, with simple poles. It is awkward to do this directly, since $r_i$ is a function of z. A practical alternative is to first approximate $r_i$ by a rational function $\tilde{r}$ of the form:

$$\tilde{r}(z) = \sum_{j=0}^{m} \left[ \frac{c_j}{z - \eta_j} + \frac{c_j^*}{z - \eta_j^*} \right] \tag{118}$$

for $\eta_1, \ldots, \eta_m$ in H, the upper half complex plane. Then:

$$r(w) = \sum_{j=0}^{m} \left[ \frac{i\Delta c_j}{1 - e^{i\Delta\eta_j}w^{-1}} - \frac{i\Delta c_j}{2} + \frac{-i\Delta c_j^*}{1 - e^{-i\Delta\eta_j^*}w} - \frac{-i\Delta c_j^*}{2} \right].$$

Notice that, for a fixed z, $r(e^{iz\Delta})$ can be made arbitrarily close to $\tilde{r}(z)$ by taking $\Delta$ small enough. The contribution of the bound states to the energy of the designed pulse is then approximately:

$$4 \sum_{k=1}^{m} \mathcal{F} \eta_k.$$

With this choice of bound state data, the right Marchenko kernel, f(n) vanishes for n>0.

There are many possible techniques for choosing the rational function $\tilde{r}$. The method used to compute the examples shown in FIG. 6 is to first fix m, the number of the poles, and then constrain the locations of the individual poles. A Newton type algorithm is then used to determine the precise locations of the poles $\zeta_1, \ldots, \zeta_m$, so that the $L^2$ norm of $|\tilde{r}-r_i|$ can be made as small as possible. In general, poles close to the x-axes add relatively little energy, but tend to result in long pulses, whereas poles with large imaginary parts tend to yield short, high energy pulses.

FIG. 6 illustrates a variety of self refocused 90° pulses that were designed by using different rational approximations, r, for the desired reflection coefficient. The poles of r in the unit disk were then used to define the bound states. As expected, a pulse was produced that required no rephasing time. The pulses are shown on the left of FIG. 6 and the magnetization profiles they produce are shown on the right of FIG. 6. These profiles are obtained without any rephasing time.

Arbitrary profiles and bound states. A last group of examples demonstrates that the bound states are indeed auxiliary parameters in the pulse design problem. FIG. 7 shows four pulses, and the transverse magnetization profiles they generate. Each pulse is generated using a single reflection coefficient, along with data specifying bound states. The bound states in these examples are specified in terms of the continuum inverse scattering data, i.e., the location of the pole, and a norming constant, as in Equation (118). The pulses are evidently quite different from one another, but nonetheless, produce the same transverse magnetization profile.

FIG. 7 illustrates a variety of 90° pulses illustrating the effects of adding bound states. FIG. 7(a) illustrates the minimum energy pulse with the given magnetization profile, M. The other three pulses were obtained by augmenting the magnetization profile data, with the indicated bound states. To the right of the pulse is the transverse magnetization profile it generates. For example, FIG. 7(b) illustrates the pulse with magnetization profile, M, and a bound state at 0.5i, with norming constant 1.0. FIG. 7(c) illustrates the pulse with magnetization profile, M, and bound states at 0.5i+1.4, and 1.0i−1.0, with norming constants 1, and −10. FIG. 7(d) illustrates the pulse with magnetization profile, M, and bound states and i−1, i, and i+1, with norming constants 1, 2 and 1.

Wavelet example. In this example, a standard wavelet is used to define the x-magnetization. Such pulses were earlier constructed by several investigators using the SLR method; a discussion is provided by Panych in "Theoretical comparison of Fourier and wavelet encoding in magnetic resonance imaging," IEEE Trans. on Med. Imag., Vol. 15 (1996), pp. 141–153. If $\psi(\xi)$ is a wavelet, then:

$$m_1(\xi)=\psi(\xi), m_2(\xi)=0, m_3(\xi)=\sqrt{1-\psi^2}. \qquad (119)$$

The Mexican hat wavelet is defined by the function:

$$\psi(\xi) = \frac{4}{\sqrt{3\pi}}(1-\xi^2)e^{-\frac{\xi^2}{2}}. \qquad (120)$$

FIG. 8(a) shows the minimum energy IST pulse producing the transverse magnetization defined by $\psi(\xi)$, which is shown in FIG. 8(b). In this example, the Marchenko equations were solved using simple iteration. The pulse took less than a minute to compute.

Conclusion

A practical algorithm is derived which implements an approach to pulse design via the inverse scattering transform. The algorithm uses the idea of the hard pulse approximation, which is also employed in the SLR approach. There are two principal differences with the SLR approach. (1) The algorithm of the invention works, throughout the design process, with the full magnetization profile. In SLR only the flip angle profile is used, and direct control on the phase of the transverse magnetization is lost. (2) The algorithm of the invention uses a different recursive algorithm to recover the hard pulse from the scattering data. This algorithm, which is a discrete version of the Marchenko equation formalism from inverse scattering theory, allows for the inclusion of arbitrary bound states. The recursion in accordance with the algorithm of the invention is as fast as the standard SLR approach. By using both the left and right Marchenko equations, the algorithm of the invention controls the instabilities which arise in the solution of the pulse synthesis problem when bound states are present.

The approach of the invention is called the discrete inverse scattering transform or DIST. Using the DIST, the full range of the solutions to the pulse design problem are recovered that are present in the continuum model. In particular, for a fixed magnetization profile, there is an infinite dimensional space of DIST pulses that produce the desired profile. A formula is provided for the energy of the pulse in terms of its magnetization profile, and the locations of the bound states. This formula is a direct analogue of the formula for the energy of the pulse in the continuum case. This formula makes explicit the dependence of the energy on the magnetization profile and the location of the bound states. This is very useful in the design of self refocused pulses with a small amount of additional energy coming from the bound states.

In the DIST approach one does not have direct control on the duration of the pulse. For minimum energy pulses, however, one can control the rephasing time. In the case of minimum energy pulses, the effect of $T_2$-relaxation is principally a function of the rephasing time.

Thus, the present invention relates to a method for obtaining RF-pulse envelopes that produce a specified magnetization profile to within a predetermined error based on a hard pulse approximation. The method of the invention has two facets, a continuum theory that describes exact solutions to idealized problems and an idealized theory that has a variety of different discrete manifestations which can be used to construct implementable algorithms. In all NMR cases, the input data is a magnetization profile. This is a unit 3-vector-valued function of a single real variable which, in most applications, vanishes outside a bounded interval. The goal of the invention is to design an RF-envelope, implementable on an NMR imaging device, which will a produce a good approximation to the desired magnetization profile.

The continuum model provides a general solution and includes the steps of choosing an approximation to the magnetization profile, choosing auxiliary parameters such as bound states and norming constants, constructing the left and right Marchenko kernels from the selected data (including the auxiliary data), and solving the left and right Marchenko equations to give the desired RF-pulse envelope. When auxiliary parameters are present, one encounters significant numerical difficulties when trying to solve the Marchenko equations in order to obtain the pulse envelope from the magnetization profile and auxiliary data. The left Marchenko equation is introduced as a way to reduce the numerical instabilities. This leads to more stable problems, which can be solved on a digital computer.

The analogous steps for one possible discrete implementation of this general solution requires an algorithm to solve the Marchenko equations. The methods of the invention include the use of a very efficient, stable algorithm referred to herein as the discrete inverse scattering transform (DIST) to solve these equations and to thereby obtain pulse envelopes from the magnetization profile and auxiliary parameters. The algorithm also uses a hard pulse approximation.

The DIST in accordance with the invention includes the steps of approximating the reflection coefficient by an exponential polynomial and, if there is auxiliary data, encoding the auxiliary data as further exponential polynomials. Out of the resulting data, one constructs the left and right discrete Marchenko kernels. Using a recursive algorithm, derived using the inverse scattering formalism, the left and right discrete Marchenko equations are solved. From the solutions to the left and right discrete Marchenko equations, the RF-pulse envelope is constructed.

The approach of the invention allows one to design RF-envelopes to produce all standard pulses used in magnetic resonance including:

a. θ-flip for offset frequencies lying in a given band;
b. θ-flip for offset frequencies lying in a collections of bands;
c. Inversion and refocusing pulses; and
d. Minimum and maximum phase pulses.

In each case, an important feature of the method of the invention is that the phase of the magnetization profile is controlled throughout the design process. The resulting signal is then applied to coils of an MR device for generating a desired RF field to locally modify a magnetic field in accordance with known techniques.

Those skilled in the art will appreciate that there are in fact infinitely many solutions to the pulse design problem. Moreover, the space of solutions is described by sets of auxiliary parameters, and the method allows for the arbitrary specification of these parameters to obtain the complete set of solutions to the pulse design problem. In particular, the present inventors have provided a formula that relates the energy in a pulse envelope to the magnetization profile and the auxiliary parameters used in its design. This formula allows one to select the auxiliary parameters to obtain the minimum energy solution (no auxiliary parameters are used).

The present invention also allows one to design pulses that cannot be obtained by methods that do not control the phase or allow for the specification of auxiliary parameters. For example, the methods of the invention may be used to design:

a. Low energy self refocused pulses;
b. Pairs of half pulses with an arbitrarily specified summed transverse magnetization profile; and
c. Pulses where the flip angle profile is a specified wavelet, or any other function, and the phase is arbitrarily specified.

Because the invention allows one to arbitrarily specify the auxiliary parameters, the methods of the invention may be used to obtain many self refocused pulses producing a given magnetization profile. Using the energy formula and constrained minimization, self-refocused pulses may be found that produce the desired profile, to within a specified error, having very little additional energy.

Using the standard parameters used in SLR pulse design, in-slice ripple, out-of-slice ripple, transition width, and duration, the comparable IST pulses have been found to perform somewhat better using the techniques described herein.

Those skilled in the art will also appreciate that numerous other modifications to the invention are possible within the scope of the invention. For example, the methods of the invention may be applied to any two-level quantum system or subsystem described by the spin domain Bloch equation, such as systems in the field of spintronics and such potential applications as quantum computing where it is very important to control the phase of the excitation. Such systems may use electromagnetic waves belonging to other frequency bands besides RF, such as microwave or infrared, to produce the desired selective excitation. Accordingly, the scope of the invention is not intended to be limited to the preferred embodiment described above, but only by the appended claims.

What is claimed:

1. A method of synthesizing pulses that produce a given selective excitation profile in a system including at least one of a two-level quantum system and a subsystem described by the spin domain Bloch equation, comprising the steps of:
selecting an approximation to the given selective excitation profile;
selecting auxiliary data including bound states and norming constants for said given selective excitation profile;
constructing left and right Marchenko equations from the selected bound states and norming constants;
solving the left and right Marchenko equations to provide a pulse envelope that produces said given selective excitation profile; and
generating pulses to produce said pulse envelope.

2. A method as in claim 1, wherein said system includes one of a quantum computer system and a spintronics system.

3. A method as in claim 1, wherein said system is a magnetic resonance imaging system, said pulses comprise radiofrequency (RF) pulses, said approximation comprises RF envelopes, and said selective excitation profile comprises an arbitrary magnetization profile.

4. A method as in claim 3, wherein said arbitrary magnetization profile is an arbitrary unit 3 vector valued function of a single real variable.

5. The method of claim 1, comprising the additional step of generating a softened pulse approximation to said pulse envelope from the pulses generated in said generating step.

6. The method of claim 1, wherein the step of solving the left and right Marchenko equations includes the step of using a discrete inverse scattering transform (DIST) to obtain pulse envelopes from the given selective excitation profile and auxiliary data.

7. The method of claim 6, wherein the step of solving the left and right Marchenko equations comprises the step of specifying bound states and norming constants for reduced scattering data subject to constraints on the energy to be used in said discrete inverse scattering transform.

8. The method of claim 6, comprising the additional step of increasing the energy of the pulse envelope in order to reduce rephasing time while maintaining a constraint on the energy to be used in said discrete inverse scattering transform.

9. The method of claim 6, wherein the step of using the DIST to obtain pulse envelopes includes the steps of:
using a hard pulse approximation to approximate a reflection coefficient that is determined by said given selective excitation profile by an exponential polynomial;
if there is auxiliary data, encoding the auxiliary data as further exponential polynomials;
constructing left and right discrete Marchenko equations from the encoded auxiliary data;
using a recursive algorithm to solve the left and right discrete Marchenko equations; and
constructing a pulse envelope from solutions to the left and right discrete Marchenko equations.

10. The method of claim 1, wherein said pulse envelope generating step comprises the step of generating a minimum energy pulse that produces the given selective excitation profile.

11. The method of claim 1, wherein said pulse envelope generating step comprises the step of generating a θ-flip for offset frequencies lying in a given frequency band for magnetic resonance imaging.

12. The method of claim 1, wherein said pulse envelope generating step comprises the step of generating a θ-flip for offset frequencies lying in a collection of frequency bands for magnetic resonance imaging.

13. The method of claim 1, wherein said pulse envelope generating step comprises the step of generating inversion and refocusing pulses for magnetic resonance imaging.

14. The method of claim 1, wherein said pulse envelope generating step comprises the step of generating minimum and maximum phase pulses for magnetic resonance imaging.

15. The method of claim 1, wherein said pulse envelope generating step comprises the step of generating low energy self refocused pulses for magnetic resonance imaging.

16. The method of claim 1, wherein said pulse envelope generating step comprises the step of generating pulses where a flip angle profile is an arbitrarily specified function and the phase is arbitrarily specified for use in magnetic resonance imaging.

17. A method of generating a desired frequency dependent excitation in a system including at least one of a two-level quantum system and a subsystem described by the spin domain Bloch equation using selective pulses for a given selective excitation profile corresponding to said desired frequency dependent excitation, comprising the steps of:
  selecting an approximation to the given selective excitation profile;
  selecting auxiliary data including bound states and norming constants for said given selective excitation profile;
  constructing left and right Marchenko equations from the selected bound states and norming constants;
  solving the left and right Marchenko equations to provide a pulse envelope that produces said given selective excitation profile;
  generating pulses to produce said pulse envelope; and
  applying the generated pulses to said system to obtain the desired frequency dependent excitation.

18. A method as in claim 17, wherein said system is a magnetic resonance imaging system, said pulses comprise radiofrequency (RF) pulses, said approximation comprises RF envelopes, and said selective excitation profile comprises an arbitrary magnetization profile.

19. A method as in claim 18, wherein said arbitrary magnetization profile is an arbitrary unit 3 vector valued function of a single real variable.

20. The method of claim 17, wherein said applying step comprises the steps of generating a softened pulse approximation to said pulse envelope from the pulses generated in said generating step and applying said softened pulse approximation to said system.

21. The method of claim 17, wherein said pulse envelope generating step comprises the step of generating a minimum energy pulse that produces the given selective excitation profile.

22. The method of claim 17, wherein said pulse envelope generating step comprises the step of generating a θ-flip for offset frequencies lying in a given frequency band for magnetic resonance imaging.

23. The method of claim 17, wherein said pulse envelope generating step comprises the step of generating a θ-flip for offset frequencies lying in a collection of frequency bands for magnetic resonance imaging.

24. The method of claim 17, wherein said pulse envelope generating step comprises the step of generating inversion and refocusing pulses for magnetic resonance imaging.

25. The method of claim 17, wherein said pulse envelope generating step comprises the step of generating minimum and maximum phase pulses for magnetic resonance imaging.

26. The method of claim 17, wherein said pulse envelope generating step comprises the step of generating low energy self refocused pulses for magnetic resonance imaging.

27. The method of claim 17, wherein said pulse envelope generating step comprises the step of generating pulses where a flip angle profile is an arbitrarily specified function and the phase is arbitrarily specified for use in magnetic resonance imaging.

28. A method as in claim 17, wherein said system includes one of a quantum computer system and a spintronics system.

29. The method of claim 17, wherein the step of solving the left and right Marchenko equations includes the step of using a discrete inverse scattering transform (DIST) to obtain pulse envelopes from the given selective excitation profile and auxiliary data.

30. The method of claim 29, wherein the step of using the DIST to obtain pulse envelopes includes the steps of:
  using a hard pulse approximation to approximate a reflection coefficient that is determined by said given selective excitation profile by an exponential polynomial;
  if there is auxiliary data, encoding the auxiliary data as further exponential polynomials;
  constructing left and right discrete Marchenko equations from the encoded auxiliary data;
  using a recursive algorithm to solve the left and right discrete Marchenko equations; and
  constructing a pulse envelope from solutions to the left and right discrete Marchenko equations.

31. The method of claim 29, wherein the step of solving the left and right Marchenko equations comprises the step of specifying bound states and forming constants for reduced scattering data subject to constraints on the energy to be used in said discrete inverse scattering transform.

32. The method of claim 29, comprising the additional step of increasing the energy of the pulse envelope in order to reduce rephasing time while maintaining a constraint on the energy to be used in said discrete inverse scattering transform.

* * * * *